United States Patent
Rhim et al.

[11] Patent Number: 6,006,022
[45] Date of Patent: Dec. 21, 1999

[54] CROSS-LINKED DEVELOPMENT AND DEPLOYMENT APPARATUS AND METHOD

[75] Inventors: Hotaek Rhim, Northborough; Russell David Hayden, Stow; William Chester Rea, Natick, all of Mass.

[73] Assignee: Microsystem Synthesis, Inc., Westborough, Mass.

[21] Appl. No.: 08/749,456

[22] Filed: Nov. 15, 1996

[51] Int. Cl.[6] .............................. G06F 9/455; G06F 17/50
[52] U.S. Cl. ............................... 395/500.02; 395/500.17; 395/500.47; 395/500.49; 395/702; 395/710
[58] Field of Search .................................. 364/488, 489, 364/490, 491; 395/500, 500.02, 500.17, 500.35, 500.44, 500.47, 500.49, 702, 710

[56] References Cited

U.S. PATENT DOCUMENTS

| | | | |
|---|---|---|---|
| 5,477,475 | 12/1995 | Sample et al. | 364/578 |
| 5,546,562 | 8/1996 | Patel | 395/500 |
| 5,721,690 | 2/1998 | Asaka | 364/489 |
| 5,758,123 | 5/1998 | Sano et al. | 395/500 |
| 5,768,567 | 6/1998 | Klein et al. | 395/500 |
| 5,835,751 | 11/1998 | Chen et al. | 395/500 |
| 5,838,948 | 11/1998 | Bunza | 395/500 |

*Primary Examiner*—Kevin J. Teska
*Assistant Examiner*—Thai Phan
*Attorney, Agent, or Firm*—Maureen Stretch

[57] ABSTRACT

A cross-linked development and deployment system that links system design, simulation, real-time emulation, integration, and in-system verification to system implementation in the field, creating final products that are field programmable systems on printed circuit boards or field programmable systems on silicon. In a preferred embodiment, hardware and software models are created and verified in an integrated co-development environment. These models can be synchronized with each other and can also be used for in-circuit emulation and in-system verification of the system under development. Once the system has gone through verification and completed system integration, the system design database that has been generated from that testing is used to program either a field programmable printed circuit board or a field programmable system on silicon. In either case, connections are embedded in the field programmable final product that enable it to link back into the integrated co-development environment so that results created by the final product can be compared with results stored in the integrated co-development environment. The final product can also be connected to the integrated co-development environment for further analysis.

14 Claims, 19 Drawing Sheets

CROSS-LINKED DEVELOPMENT AND DEPLOYMENT APPARATUS AND METHOD

BACKGROUND OF THE INVENTION

1. Field of the Invention

This invention relates generally to the field of Electronics Design Automation (EDA) systems, and more specifically, to EDA systems used for systems design and testing of systems based on microprocessors, peripherals, special purpose functional macros, and user specific custom logic.

2. Background

Modern electronics systems increase in complexity with each new generation. System development time tends to increase as a function of system complexity. Simultaneously, competitive pressures require ever shorter development and time to market cycles, making time-to-market a critical success factor in the industry. Product life cycles are also getting shorter. Thus, customers require more complex products, which take more time to develop, but market pressures dictate that the products be developed in much shorter cycles than ever before.

Additionally, many electronics designers are asked to build chips that include on one chip not only the microprocessor, but also several peripherals that may be needed for an embedded target application. As an example, some of the microelectronics controls that are built into space vehicles, airplanes, new cars or even appliances might include a chip that has a microprocessor, several analog to digital or digital to analog converters, a hard disk controller, possibly some other peripherals, custom user hardware logic as well as application software to cause the chip to perform the specific functions for the target application. If there is an error in the design that causes the system to malfunction, it can cost as much as $100,000 or more to "re-spin," that is, re-layout the chip, manufacture it, etc. to correct the problem.

Designers are thus being asked to build more complex chips, for lower costs, in less time than ever before, while also reducing the risk of errors which might necessitate the expense of a "re-spin."

In a typical system design, the hardware designers will put together a hardware prototype, using the final outline of the system specification and logic design. Software designers will typically write the application software. Once the hardware prototype is in place and the application software is ready, it is necessary to operate the hardware with the application software. For example, a chip that manages fuel-injection in an automobile engine may have a microprocessor connected to several analog to digital (A/D) and digital to analog (D/A) converters that are, in turn, attached to sensors attached to fuel pressure gauges, oxygen sensors, engine temperature sensors, etc.

Most microprocessors are fairly general purpose—that is, they have sets of instructions that they can handle, such as add, subtract, multiply, divide, load registers, etc. To make such a microprocessor actually manage fuel-injection, the application software specifies combinations of instructions to be executed by the microprocessor. For example, the application software may determine the sequence in which inputs are analyzed, cause the microprocessor to compute certain outputs, such as the amount of fuel to be released next, how much time an injector has to be open to cause the fuel to be released, and then tell the microprocessor to signal that this is to be done by a specific injector. Signals are converted and sent through the peripherals that control or operate that injector, and the fuel is released for the calculated time period. If the fuel pressure is still not at the desired level, the sensors measuring this will signal that to the microprocessor and the process continues.

If this is the type of system under development, a hardware prototype is built and tested, while application software is being developed and tested on other machines. At some point the hardware prototype has to be operated with the application software, to see if it all works. The process of evaluating newly designed hardware with new application software is known as systems integration.

The first time system integration takes place, it is very probable that the complete system will not function properly. When the system malfunctions, the cause could be any of its elements. For example, the microprocessor might have a design flaw in its floating point arithmetic logic that causes errors with certain kinds of large numbers. Or, the application software might have a "bug" or defect in the way it analyzes input. Or, the custom hardware user logic that controls the sensor readings might be defective. Sometimes the defect may cause results that are hard to interpret, and thus hard to "debug."

In the fuel-injection example, if too little fuel is being released, is it because the hardware is in error (and if so, is it the microprocessor or one of the A/D converter peripherals, or the system interconnect or the custom user logic?) or because the application software is in error (and if so, where and in what set of circumstances?) or is it a combination of two or more elements? Figuring out what causes the problem is the art of "debugging." If the designer has a guess about what the cause of the flaw or bug might be, it would be desirable to be able to isolate the problem, recreate all the conditions exactly as they occurred at the time the error was noticed, and try to see which element caused the bug and what can be done to fix it.

The earlier that each element is debugged, and the earlier that systems integration and systems-level debugging can be done in the development cycle, the faster the product will get to market. However, if the designer tries to move too quickly, and the product is fixed in final form before all the significant bugs have been removed, it can lead to costly re-spins, and loss of customer satisfaction in the market.

To help achieve these goals, many design, development, testing aids and rapid prototyping aids have been developed. Most of these, however, are limited in function and apply to only to one or another subset of design questions, usually not to the system under development as a whole, nor to the whole cycle from development to field test and final product.

For example, one of the most time consuming steps in system design is the creation of hardware prototypes for use in testing whether the new systems meet their concepts and design specifications. Another time consuming step, as mentioned, is the testing and debugging of the system as a whole, including both its hardware and any operating system or driver software. Additionally, the system under development also needs to be verified with real application software running at real-time clock frequencies and in real application conditions, a test process usually known as in-system verification. Finally, a decision has to be made about fixing the product in its final form for field test, market acceptance and production shipping.

Presently, there are tools available for testing some of these functions, but as noted, most of these are limited to testing only a subset or part of the system and they tend not to be integrated with the other subsets. For example, in-circuit emulators (ICE systems) exist, for some systems, that will emulate the microprocessor being developed so that the software can be tested. However, ICE systems usually only emulate the microprocessor, not the entire hardware system, including its peripherals. ICE systems also may require special chips known as bondout chips, for microprocessor emulation. These have special bondouts so that readouts can be taken of various internal states in the chip, such as register contents, etc.

Bondout chips are very expensive to make, and as chips become more complex in design, it becomes less and less viable to build special bondout chips to emulate them. Bondout chips, in some cases cost as much as one to two million dollars, or more, in additional chip design costs. While bondout chips can be built fairly easily for 8 or 16 bit microprocessors, as the microprocessor approaches 32 bits or 64 bits, or uses RISC technology, some form of pipelining is often introduced, especially if the chip is executing instructions every clock cycle. If a chip is using a five-stage pipeline, then five different events are happening in the pipeline all at the same time. Building a bondout chip for such a processor is extremely difficult, if not impossible. Finally, as microprocessors operate at faster speeds, in-circuit emulators are less likely to be able to support the higher speed microprocessors.

Another type of design aid available for designers today is a rapid-turn prototyper, such as that provided by Aptix Corporation, and others. These are usually reprogrammable emulators that emulate a portion of the hardware functions of the chip under development. While these can help cut development cycles, they usually do not provide a comprehensive environment for testing and analyzing the system as a whole. Quickturn Systems also provides a rapid-turn prototyper for Application Specific Integrated Circuit (ASIC) chips.

No matter what type of hardware model is employed, if the system under development is a real-time application, such as a chip to monitor fuel-injection in an automobile, the same program, when executed over and over many times in the real world tends to produce different results every time. This is caused by the asynchronous nature of real-time operations, where data coming in from external devices (such as the automobile engine) is likely to be slightly different each time. In a debugging environment, if the hardware model operates in this way, it makes it extremely difficult to replicate the hardware execution states and analyze what has happened during execution. "Intermittent" errors may occur. For example, the application program may operate correctly in the hardware model when the data comes in in small amounts, but fail when large amounts of data are received. To isolate this problem, it would be desirable to have a way to insure that the hardware model steps through handling the same large amount of data in the same time frame so that the flaw in the logic can be identified.

Attempts to help designers model the complete system also include virtual hardware prototypes—also known as software simulators. In these, the microprocessor is often modeled with HDL (Hardware Description Language) or a similar language, to produce a software simulated model of the chip. That is, the resulting "model" is a software program that might perform assembler language or machine language steps such as "if the contents of register 0 are equal to the contents of register 1 branch to the instruction to add the contents of register 2 and to register 3, storing the results in register 3." Some of the additional user's peripherals for the target application can be modeled with HDL as well. However, the simulation approach cannot provide real-time emulation or the opportunity to analyze real-time results, or in-system verification.

This is because software models tend to be quite slow in execution. A set of test data vectors or a test set run on a software simulator usually executes at a speed of thousands of instructions per second, rather than the millions of instructions per second speed at which the chip under development is designed to operate. Complete software simulators that allow system designers to describe both processors, peripherals and other logic can often be costly to create, as well.

In addition, software simulation of a real-time application may not show up bugs or defects that are time-dependent. For example, if three buffers are set aside in the application software to handle data coming in, very fast bursts of data might fill all three in the real world, causing an overflow condition that may not be easy to model in a software simulator.

And, in using either emulators or simulators, it is necessary to create a data set of test vectors or stimulators that can be incorporated into a test program so that the system or chip can be exercised according to a sequence of input patterns. Presently, in order to create test vectors, the system designers must walk through detailed system timings and combinations of input patterns, and project what the system should produce as output given those input patterns. This is usually a very time-consuming process, often taking four to six weeks or more, to accomplish, for reasonably complex systems.

In trying to test systems as a whole, it is desirable to be able to create "what-if" scenarios and then analyze the behavior that results. In the example of fast bursts of incoming data, this could theoretically be described in a software simulator, but, as mentioned, simulators execute at speeds much slower than the real-time events they simulate. In attempting to create the scenario in a hardware model using real peripherals in real-time, identically exact scenarios may never be created, since, as mentioned above, events in real-time may occur asynchronously or unpredictably.

If the details of a given scenario cannot be replicated exactly it is harder or perhaps nearly impossible to find and debug certain kinds of errors.

Testing during co-development of the hardware and software, using several different aids is often complicated further by incompatibilities between the development aids. Ideally, if a database of test data or test vectors is gathered to test the hardware model, it is desirable to use the same sets of data for testing the software model. However, a database of test vectors in the proper format for a hardware model may not be readable or understandable to a software model and vice-versa.

Product development does not stop when the design, simulation, real-time emulation, behavior analysis and in-system verification are completed. Instead, the first steps of product deployment usually occur, in which the "final" product is produced, usually in small to moderate quantities, at first, and placed in field tests or market acceptance evaluations.

Using the fuel injection example, again, it may be desirable to make final products which will be installed in real production vehicles for field testing. If the design has been thoroughly verified in the earlier testing phases, it is likely that the "final" versions of the product will function as intended during field test. If not, the product must be debugged and further testing performed. Even if the product works well in field test, the system may require fine tuning, resulting in hardware design modifications in some cases or application software changes in other situations.

Customers might also require additional functions, or request that the existing functions perform in a slightly different way. An eighteen wheel truck may require a different method of fuel injection and control than that required by a 4 cylinder passenger vehicle. Hence, the same system design may need to be fine tuned for specific requirements for different models.

At the present, once "final" versions of the product are made, most, if not all, of the development aids used in testing them up to that point are no longer useful for testing the product-level implementations of the systems. System implementation of a product-level version of the system is usually accomplished by creating a printed circuit board containing the final chip together with "off-the-shelf" electronic components, or else a custom chip is created in "silicon." That is, a VLSI integrated circuit chip containing all the hardware on one chip is made by a wafer fabricating facility. Existing development aids are not designed to work with these final versions. Both of these processes for creating a final version are time consuming and costly processes, as well. Thus, if a problem occurs after the product is cast in "final" form, debugging it and then fixing it can be expensive.

Some existing techniques for final product implementation allow the designer some flexibility in case a need for changes arises. For example, there are fast turnaround Application Specific Integrated Circuit (ASIC) prototyping systems that let the designer create chips in small quantities, but only for custom user logic. These usually provide custom user logic in a single chip in a few days to a few weeks. However, they generally do not include the microprocessors or peripherals used in the system, only the custom user logic. There are also One-Time-Programmable (OTP) microprocessors which allow the designer to program a microprocessor and certain predetermined peripherals. However, the designer must build the rest of the system, including custom user logic and interconnects, around the microprocessor. Current OTP systems also usually provide RAM or ROM to house the application program storage memory as well, and this may be changeable or programmable in the field. Thus, while the application program code may be changeable in the field test, or final product versions produced by OTP methods, custom user logic and any additional peripherals or interconnects are not.

Another existing approach uses pre-fabricated system modules to achieve fast turnaround for production versions. Pre-fabricated system modules have fixed configurations tailored to specific functions. They are also fixed bus systems. Thus, if the designer needs special peripherals, custom user logic, or unique interconnects (buses), these must be added by means of an additional printed circuit board connected to the pre-fabricated system module.

In other words, while there are fast turnaround techniques that can be used to create final product versions of a system, these, too, are limited in function and flexibility. If the final product includes custom user logic, or a unique interconnect scheme or special or non-standard peripherals, then integration can only be done using a customized chip or customized printed circuit board for the final product version. Presently, there is no fast, easy way to do this. Instead, the designer must commit to an integrated chip design and manufacturing process that includes all these elements using his or her best judgments from the preceding system simulation, emulation, and behavioral analysis steps.

If the customer requires a final product as a single integrated chip, for example, is involves a certain amount of risk in committing to a chip manufacturing process without prior field testing. If the "final" product performs well, in field test, then there is no need to re-spin the final chip. However, if field testing shows up further bugs or flaws in the "final" product, another expensive re-spin may be required.

It is an object of the present invention to provide an integrated development and deployment system that permits the designer to test the whole system and readily deploy and test early production versions.

Still another object of the present invention is providing a system designer with the ability to use development and testing tools with final product versions.

A further object of the present invention is providing a system designer with the ability to create field programmable systems on printed circuit boards or field programmable systems on silicon as field test or final products.

Yet another object of the present invention is to provide a hardware model that is easily reconfigurable as part of the system.

Still another object of the invention is to provide system behavior analysis of the system under development.

SUMMARY OF THE INVENTION

These and other objects are achieved by a cross-linked development and deployment system that links system design, simulation, real-time emulation, integration, and in-system verification to system implementation in the field, creating final products that are field programmable systems on printed circuit boards or field programmable systems on silicon. In a preferred embodiment, hardware and software models are created and verified in an integrated co-development environment. In a preferred embodiment, these models can be synchronized with each other and can also be used for in-circuit emulation and in-system verification of the system under development. Once the system has gone through verification and completed system integration, the system design database that has been generated from that testing is used to program either a field programmable printed circuit board or a field programmable system on silicon. In either process, connections are embedded in the field programmable final product that enable it to link back into the integrated co-development system so that results created by the final product can be compared with results stored in the integrated co-development system. The final product can also be connected to the integrated co-development system for further analysis.

It is an aspect of the present invention that it can let a designer test the whole system under development and allows the product versions of the system to be re-tested with the same development tools if a problem arises in the field.

Another aspect of the present invention is that it can enable a system designer to create field programmable final products from a well tested database.

Another aspect of the present invention is that it can allow the software model to function as a "virtual bondout chip" when synchronized with the hardware model.

Yet another aspect of the present invention is that one integrated system can be used for design verification, hardware prototyping, in-system verification, behavior analysis, and field testing of final products.

Still another aspect of the present invention is that it permits both the hardware and the software for a system to be developed nearly simultaneously.

A further aspect of the present invention is that also can be used to greatly simplify the generation of test vectors and input stimulus for HDL simulation.

A still further aspect of the present invention is that it can enable a hardware emulation model, a field programmable system module and a field programmable system on silicon to be used interchangeably with a software simulation model, thus simplifying system development from system design to implementation and maintenance.

DETAILED DESCRIPTION OF THE INVENTION

Figure 1:
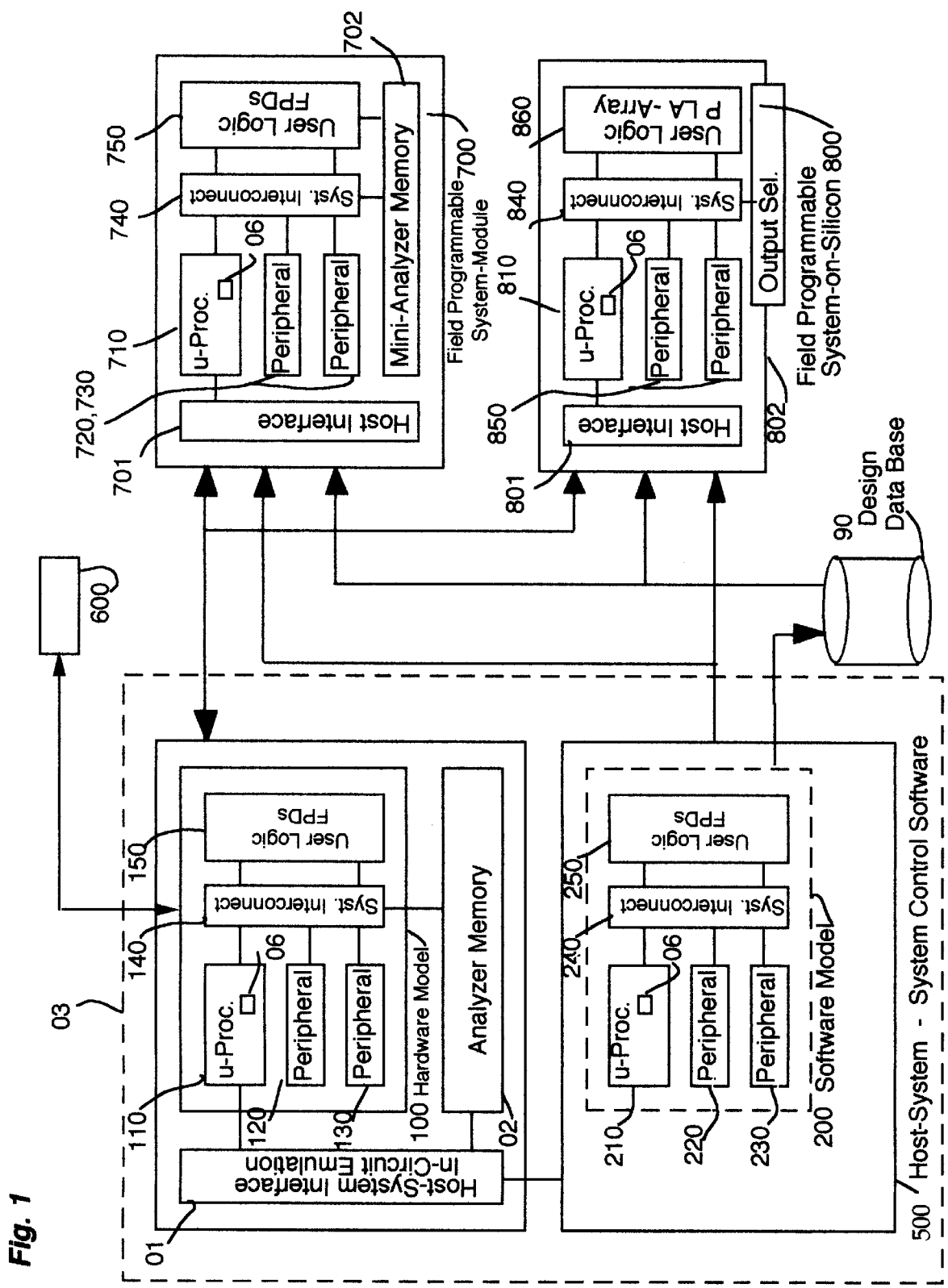
FIG. 1 is a schematic block diagram of the present invention.

In FIG. 1, a schematic block diagram of the present invention is shown. The cross-linked development and deployment environment of the present invention is depicted here. Co-development environment 03 integrates hardware model 100 with software model 200, under the control of host 500, using recording and stimulus analyzer memory (analyzer memory 02), and event detection logic to synchronize the two. Hardware model 100 provides for emulation of a microprocessor 110 under development, together with peripherals 120, and 130, system interconnect 140, field programmable devices ("FPD"), such as FPD's 150, some of which may contain custom user logic 160 (not shown). As shown here, system interconnect 140 of hardware model 100 is also connected to external device 600. Referring back to the example cited earlier, if the system being developed is one to control fuel injection, external device 600 might be the sensor connections to the actual engine and fuel injectors.

Software model 200 provides for simulation of the same elements as hardware model 100, but in software. Microprocessor 210, for example, is a software model of the hardware design for the system under development, just as microprocessor 110 is a hardware version of it. Similarly, the software model 200 provides simulations such as peripherals 220, and 230, system interconnect 240, FPD's 250, custom user logic 260 (not shown), and so on.

Still in FIG. 1, it can be seen that application software 06 can be executed either in hardware model 100, in some form, or in software model 200. In either case it will be "executed" or run in the model's version of the microprocessor under development, whether hardware model 100's microprocessor 110, or software model 200's microprocessor 210.

Thus, software model 200 is (ideally) a mirror image model of the elements shown in hardware model 100. The difference is that software model 200 is a computer program created using known simulation tools such as the Verilog simulation Hardware Description Language, while hardware model 100 is a set of physical hardware elements set to emulate the system under development. Host 500 in a preferred embodiment is a computer system, having a central processing unit and its own peripherals, such as disk drives and printers. In a preferred embodiment host 500 is usually a personal computer system with sufficient power to control the operation of hardware model 100 and the execution of software model 200. As will be apparent to those skilled in the art, however, any computer system with sufficient power to control the operation of the models could be used.

In a preferred embodiment, system development is done using these two models in a co-development environment 03, indicated in FIG. 1 by a dotted line. In this co-development environment 03, hardware model 100 and software model 200 can be used to develop a design data base 90. During the development and testing cycle, the two models can be used independently and together, to create test vectors and netlist inputs for design data base 90. The hardware and software for the final system can be developed almost simultaneously, thus the term "co-development." As will be seen later, the "final" products can also be substituted for hardware model 100, allowing them to be checked against software model 200, as well, hence the term "environment."

Still in FIG. 1, once the system has been integrated, tested and verified in co-development environment 03, the final contents of design data base 90 are used to create either a field programmable system module (FPSM) 700 or a field programmable system in silicon (FPSOS) 800 or both.

As shown in FIG. 1, FPSM 700 is a printed circuit board containing a field programmable form of the microprocessor under development, here shown as microprocessor 710, as well as field programmable forms of peripherals, shown as peripherals 720 and 730, together with the field programmable system interconnect 740, and field programmable devices (FPD) 750. In a preferred embodiment, FPSM 700 also incorporates a host interface 701 and a mini-analyzer memory 702. Mini-analyzer memory 702 permits FPSM 700 to communicate with the development tools used in co-development environment 03. In a preferred embodiment, system designers might create FPSM 700 in small quantities for an initial field test of a verified system. Since, in a preferred embodiment, FPSM 700 is typically a printed circuit board, this approach is useful when initial size and form factors are not critical for field test deployment.

In a preferred embodiment, the system designer also has the option to create a field programmable system on silicon 800, from the contents of design data base 90 as shown in FIG. 1. In one preferred embodiment, the system designer could implement the system directly in silicon, by creating FPSOS 800, bypassing the creation of a FPSM 700, (printed circuit board form). This might be the only option when field testing requires that a very small form factor or size of the final product (the system on a single piece of silicon) be used. As seen in FIG. 1, when a FPSOS 800 chip is created, it contains host interface 801, which performs a function analogous to FPSM 700's mini-analyzer memory 702. Thus, FPSOS 800 can also be used to communicate with the tools used in co-development environment 03.

In another alternative preferred embodiment, the system designer might also wish to create FPSM 700 first, using the printed circuit board for field testing and early market acceptance tests, and then create the FPSOS 800 single chip form for volume production. In this approach, if refinements need to be made to the system under development, FPSM 700 can be reprogrammed and tested with the tools of co-development environment 03. In this instance, FPSM 700 will usually provide a better hardware "model" for in-system verification in a real-time environment, because the implementation on printed circuit board will usually operate at higher (and therefore, usually faster) frequencies than the earlier in-circuit emulators or rapid-turn prototypers that were first used for hardware emulation. The same is true for FPSOS 800. In a preferred embodiment, either FPSM 700 or FPSOS 800 can also be the final end product, if no further changes are required.

During the product life of the system under development, the present invention also makes it much easier to add and test enhancements or fix problems in new versions of the system.

Figure 1A:
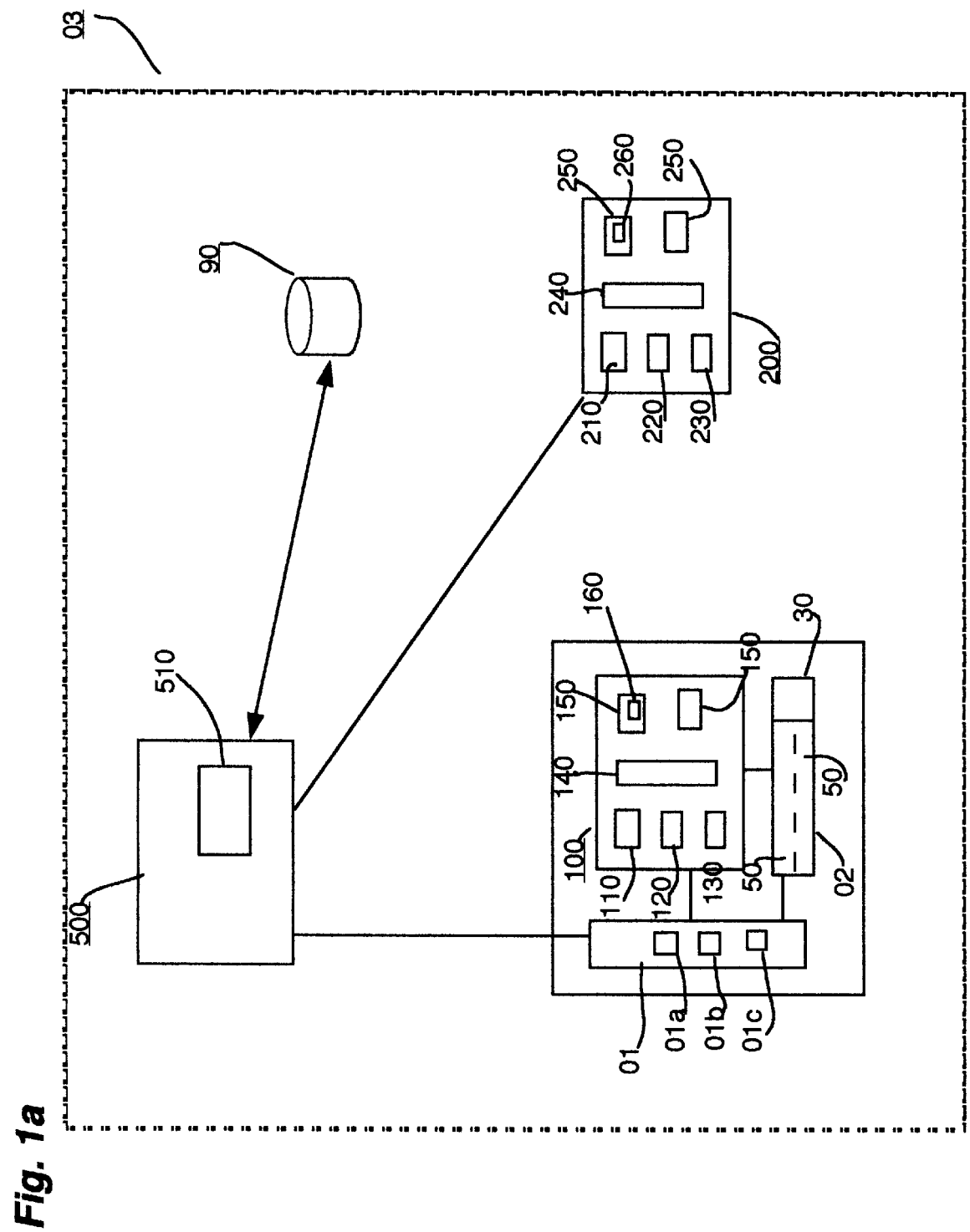
FIG. 1a is a schematic block diagram of the co-development environment of the present invention.
Figure 1B:
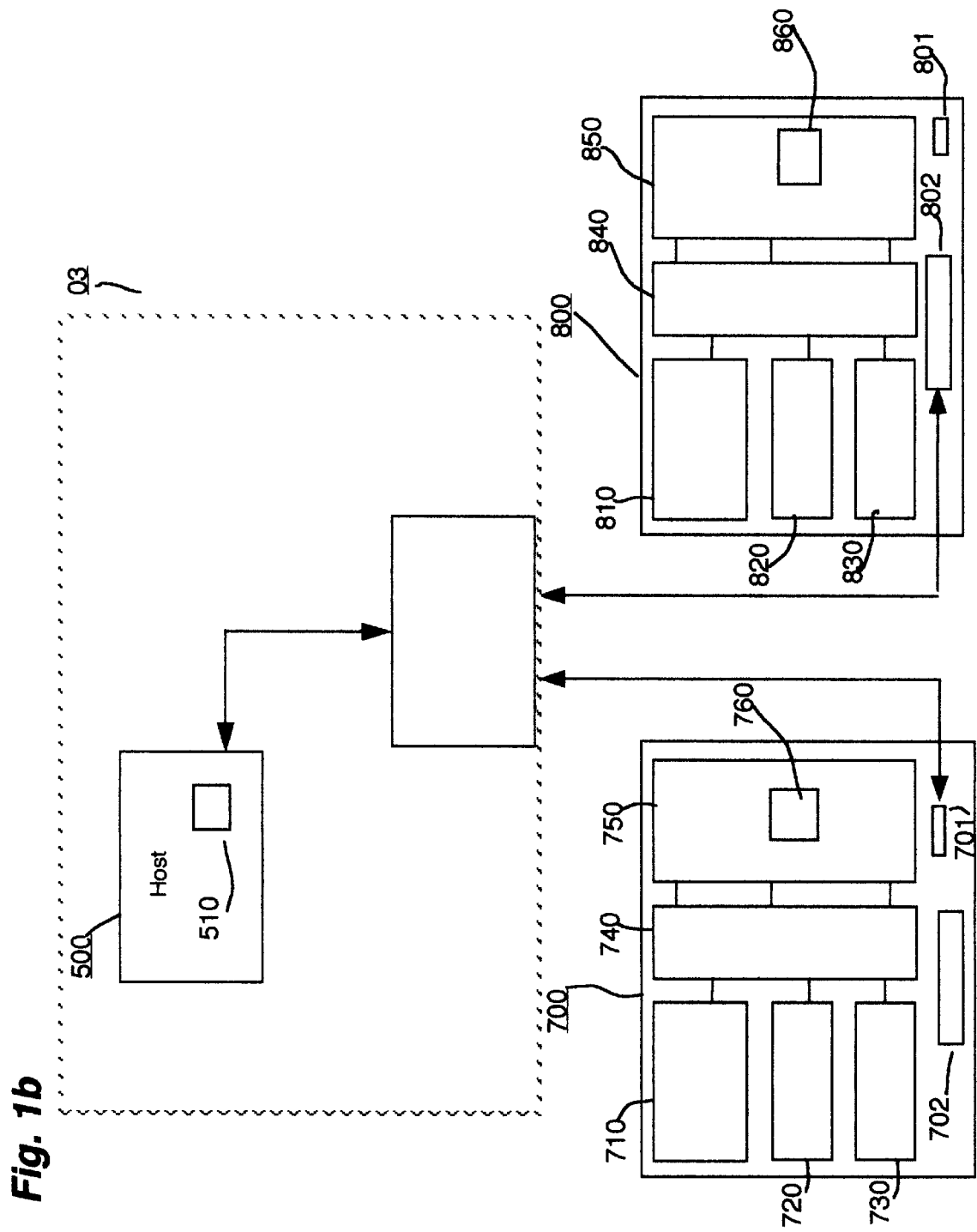
FIG. 1b is a schematic block diagram of the system implementation environment of the present invention.

Turning now to FIG. 1*a*, co-development environment 03 is shown. In a preferred embodiment, co-development of application software and system hardware can be done using hardware model 100 and software model 200, both communicating with and controlled by host 500. In hardware model 100, analyzer memory 02 is shown communicating with host 500 and hardware model 100 through host interface 01. In a preferred embodiment, analyzer memory 02 is a random access memory array organized into frames of a predefined size. In one preferred embodiment it has approximately 64000 frames, each containing 512 bits. In another preferred embodiment, the same size memory can be structured as about 128000 frames each frame containing 256 bits. As will be apparent to those skilled in the art, various other sizes and structures of memory can be used. For example, in a larger size of memory, perhaps 256,000 frames 1028 bits in size might be used. Analyzer memory 02 records various events during execution of the hardware model 100.

The first function performed by analyzer memory 02 is continuous recording into the full analyzer memory 02 to allow the system designer to examine microprocessor and user logic, and external connections status while running at full clock speed, to generate system test vectors and HDL simulation input stimulus. These latter are stored in design database 90.

Still in FIG. 1*a*, the second function performed by analyzer memory 02 is block recording at every event detected by event detection logic 30, shown in FIG. 1*a* as part of analyzer memory 02. As will be apparent to those skilled in the art, while event detection logic 30 operates as part of analyzer memory 02 in one preferred embodiment, parts of it could also operate as part of control software 510 in host 500, or as part of host interface 01.

When analyzer memory 02 is used to record events, the analyzer memory 02 is configured as circular buffers 50 whose size is user selectable. During the execution of the application software running in hardware model 100, analyzer memory 02 continuously records the state information into circular buffer(s) 50.

Events which can be detected according to the method and apparatus of the present invention include, but are not limited to, such items of interest as exception conditions, branch and subroutine calls, system events such as load or store values to and from system memory, and system interface with external devices. As will be apparent to those skilled in the art, other items of interest that can be detected during execution of a hardware model could be selected as the events to watch for.

In a preferred embodiment, the user can selectively configure the events to be detected. When one of these occurs, it is detected by event detection logic 30 and the hardware model's internal register contents are read and stored in Host 500. Next analyzer memory 02 proceeds to record further events until it records one half of the set size of a first circular buffer 50. When one-half of a first circular buffer 50 is filled, the analyzer memory 02 starts recording in a second circular buffer 50. To illustrate, assume a user sets the size of circular buffers 50 to 64 frames each. At first, analyzer memory 02 will continuously record during program execution in hardware model 100. If none of the user-specified events occurs, analyzer memory will overwrite the first circular buffer 50, continuously. When a user-specified event is detected, event detection logic 30 will record the event, a time stamp, and the address of the frame where the event was detected into analyzer memory 02. Since a user specified event has occurred, analyzer memory 02 will now record only 32-frames (half the size of circular buffer 50) after the event. Thus first circular buffer 50 will now contain the 32 frames that preceded the event and the 32 frames that followed it.

Figure 4:
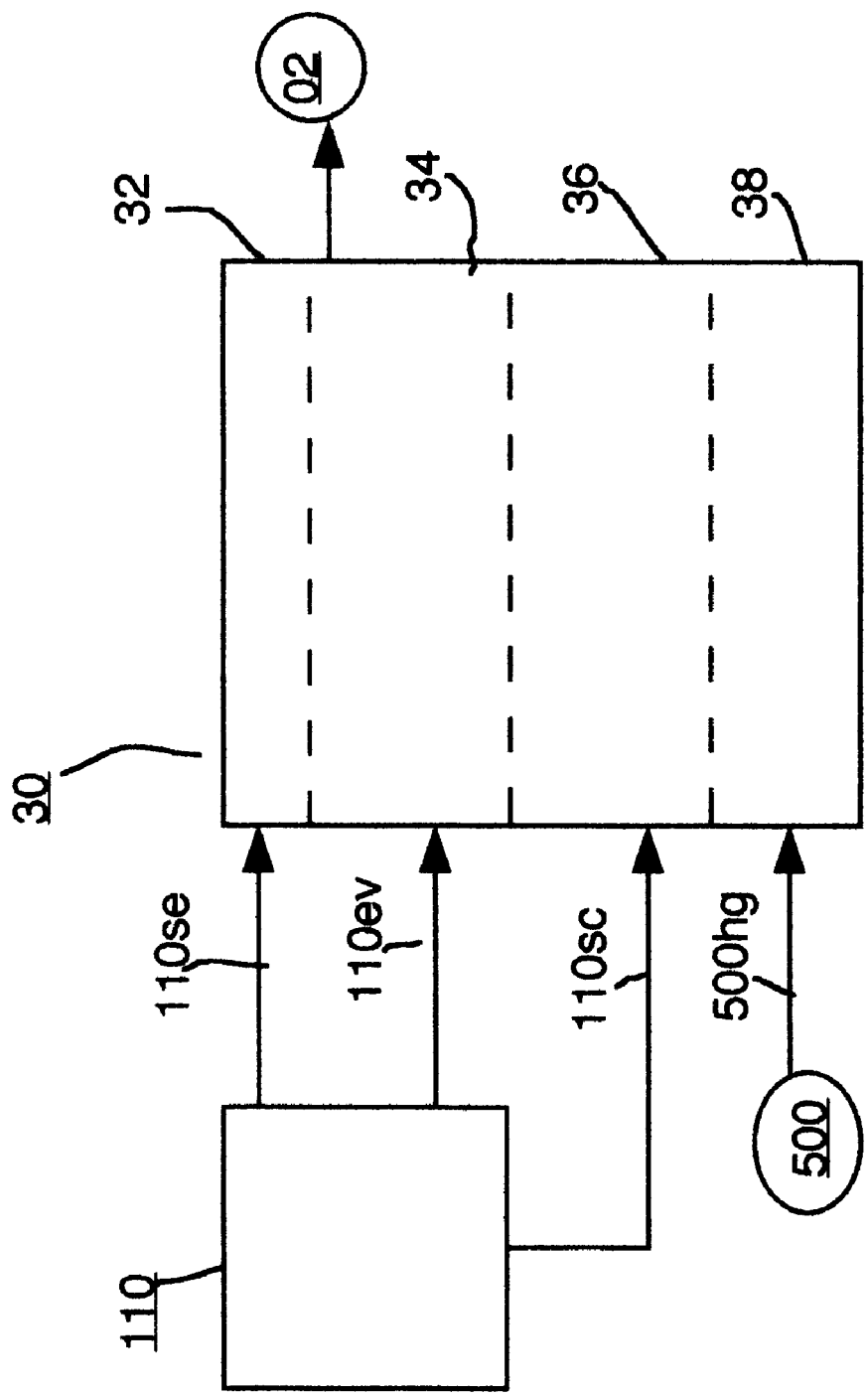
FIG. 4 is a schematic block diagram of the event detection logic of the present invention.

Event detection logic 30 is illustrated in FIG. 4. As is shown in FIG. 4, in a preferred embodiment, four general classes of events can be selectively detected. First, system events 32, such as Load, store, I-cache, D-cache events can be detected. Next, exception vector base addresses 34 can be detected, such as cold/soft reset, NMI, cache error, TLB refill, and other exceptions. System control signals 36, such as system commands, address data, and system control signals are also detectable. And, additionally, host-system generated events 38 can be detected, such as events specifically generated by the system control software 510 in host 500 for the co-development environment. As shown in FIG. 4, the events that are detected are recorded in analyzer memory 02.

Figure 3:
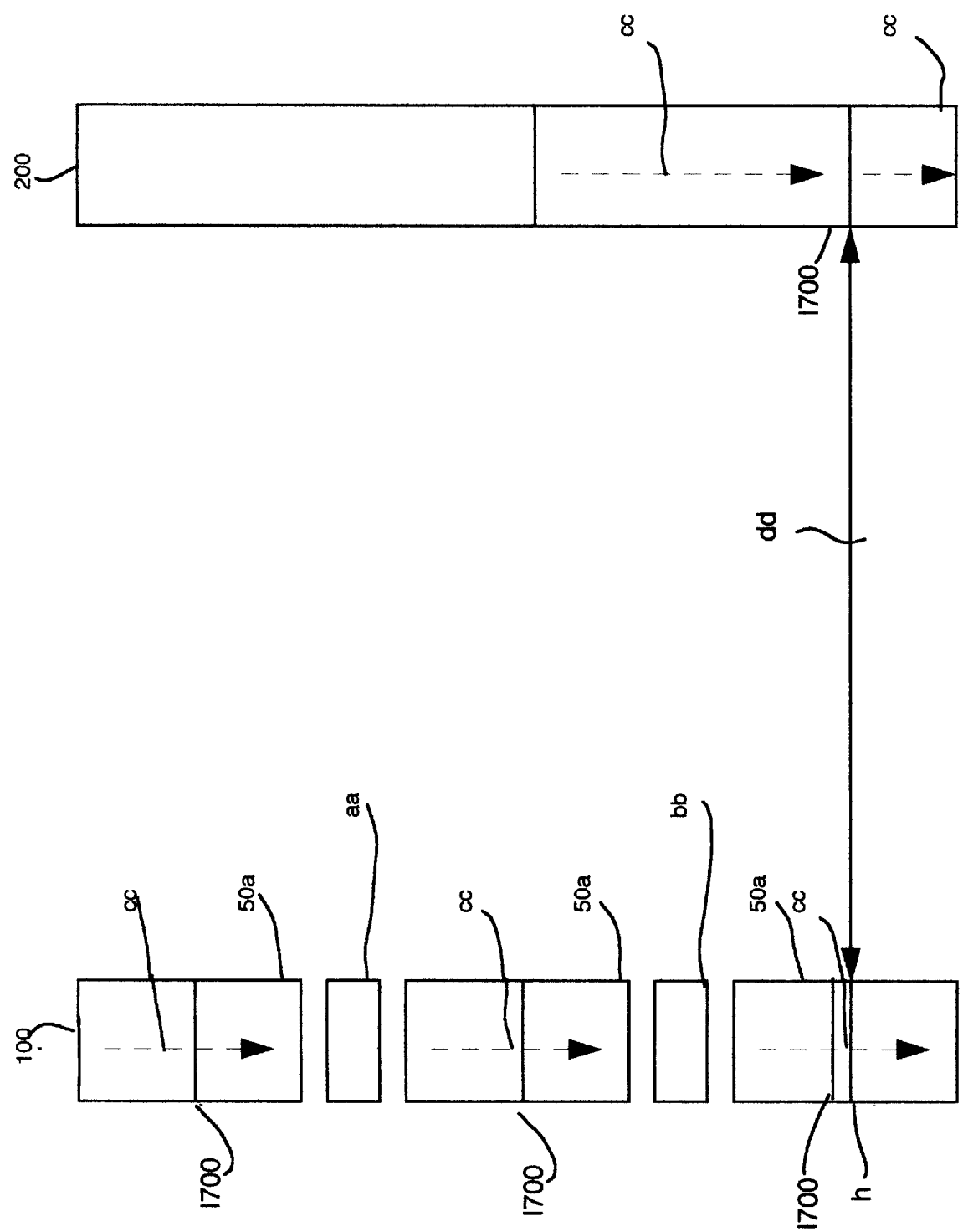
FIG. 3 is a schematic block diagram of the synchronization process according to the method and apparatus of the present invention.

Turning now to FIG. 3, the use of event detection logic for synchronization of hardware model 100 with software model 200 is illustrated schematically. The direction of processing is shown both for hardware model 100 and software model 200 by dotted lines cc. As hardware model 100 causes microprocessor 110 to execute each instruction of application software 06, the events are recorded continuously in first circular buffer 50a. In FIG. 3, it should be noted that the same elements of hardware model 100 are shown three times to illustrate how synchronization occurs.

When event detection logic 30 detects an event of the user-specified type at instruction 1700 in first circular buffer 50a, as shown in FIG. 3, event detection logic 30 identifies the event, time stamps it, and stores the register contents at point aa, which is a memory location in host 500. After the event detect, event detection logic 30 will cause the hardware model to continue executing, recording the results in the next one-half of the set circular buffer size. As a result, analyzer memory 02 keeps records for the 32 frames that occurred before the detected event at 1700 and the 32 frames that occurred after it was detected. If the event were a cache miss, for example, this would record all the external transactions to service the cache miss after the event, as well as the 32 frames leading up to it. Execution of the microprocessor 110 continues with periodic interrupts to record register values into point bb, etc., until a haltable user defined event is detected by event detection logic 30, which causes hardware model 100 to halt at point h. Next, software model 200 is activated by system control software 510, (running in host 500) and the register contents and machine states for the last event prior to the halting of hardware model 100 are loaded into the simulated registers of software model 200. System control software 510 then steps through software model 200, one instruction at a time, comparing the results of each instruction or event in software model 200 with the contents of the last circular buffer 50a in analyzer memory 02 prior to the halting of hardware model 100.

Next, software model 200 is activated by system control software 510 and the register contents and machine states stored for the last event (1700) prior to halting hardware model 100 are loaded into the simulated registers of software model 200. System control software 510 then steps through the software model 200, one instruction at time, comparing the results of each instruction or event in software model 200 with the contents of first circular buffer 50a in analyzer memory 02 following the event detection 1700 and wrapping around to the frames occurring before the event was detected.

Hardware model 100 is kept in a frozen state. In other words, all processing stops in hardware model 100 at the point where the last event was recorded.

In many cases, when software model 200 is single-stepped through its execution for a few instructions, hardware model 100 and software model 200 will be in synchronization within a few frames of circular buffer 50a. From that point on, they can be single-stepped through together in debugging mode. In this mode, software model 200 acts as a virtual bondout chip for microprocessor 110.

However, there may be some cases where synchronization does not occur between hardware model 100 and software model 200. In such cases, one or more strategies for resynchronization can be applied by the system control software 510, such as restoring software model 200's register contents from an earlier saved circular buffer 50, or trial alterations of software model 200's internal node stacks, or analysis of previous activity as gathered by analyzer memory 02.

Figure 7:
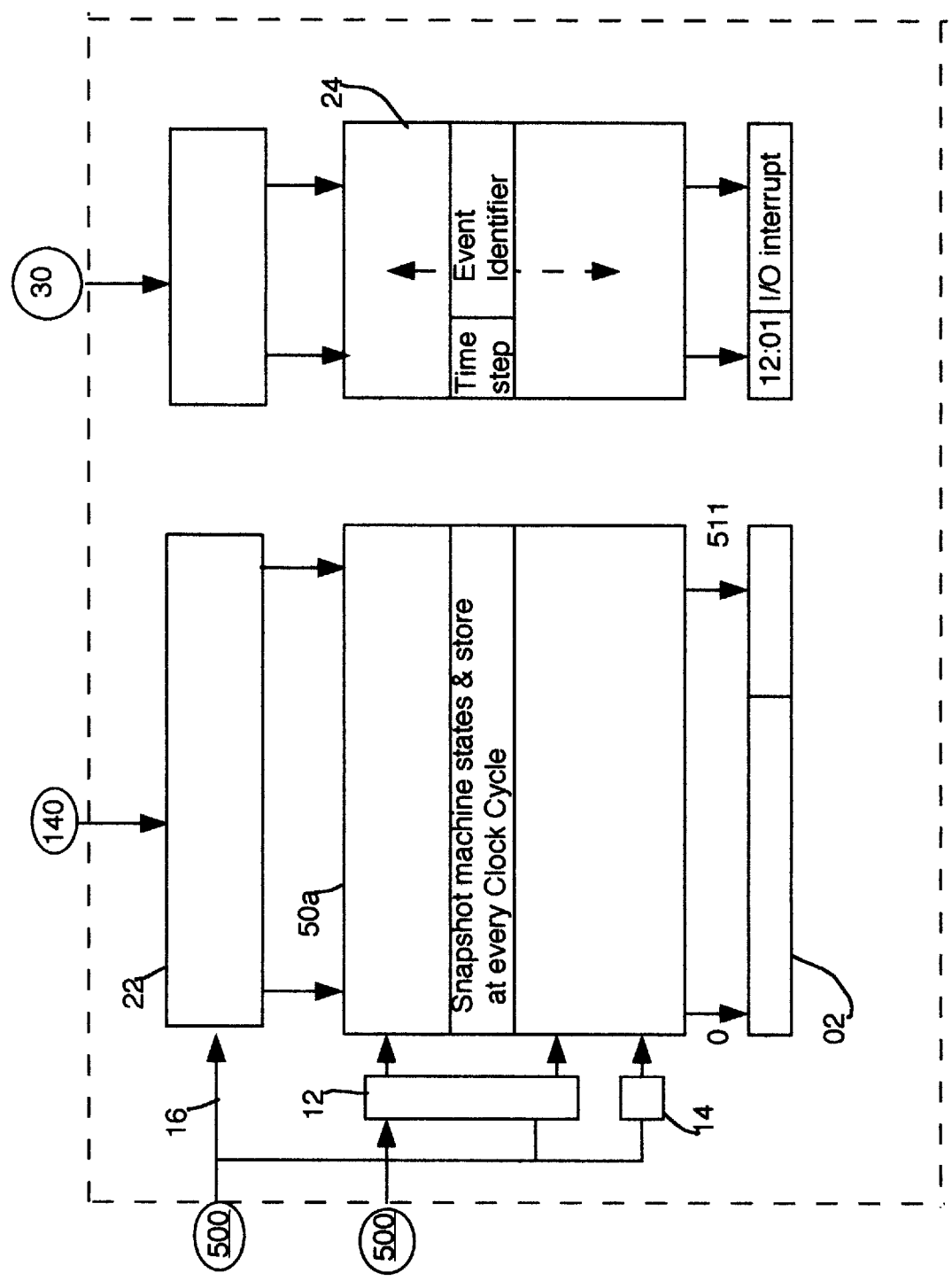
FIG. 7 is a schematic view of the analyzer memory of the present invention.
Figure 8:
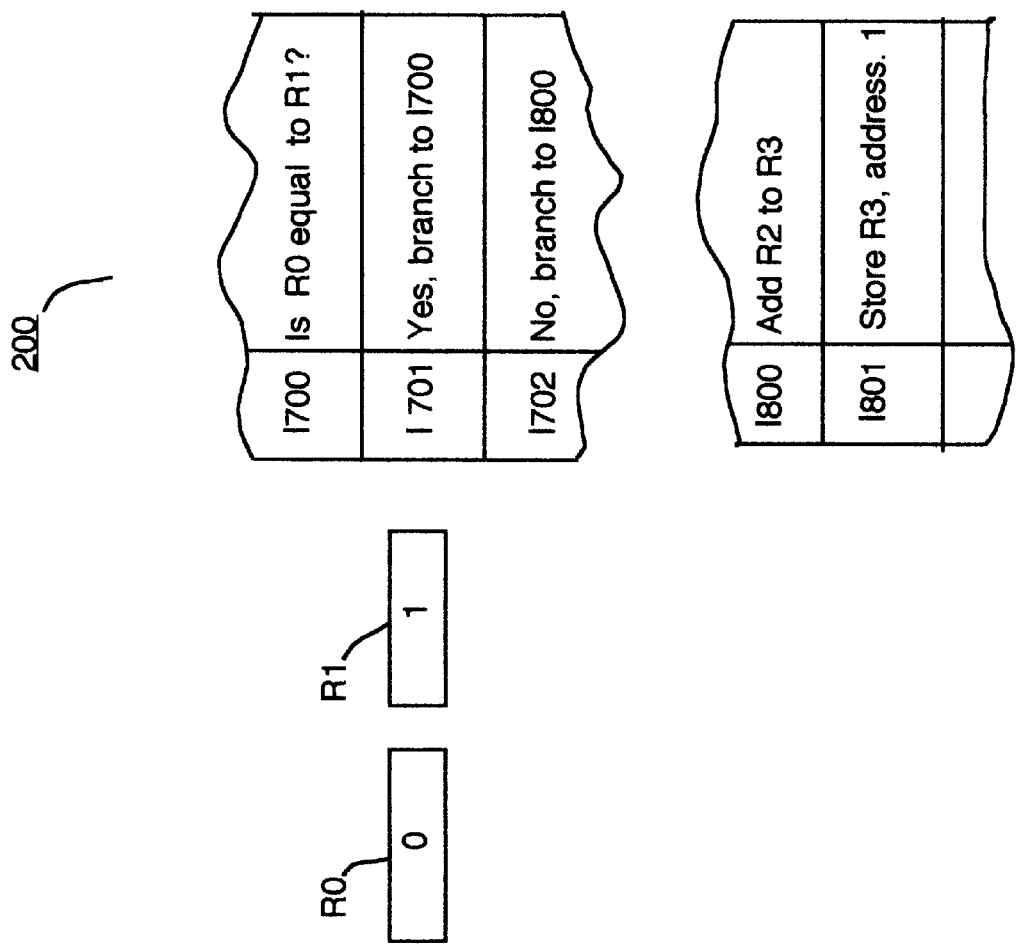
FIG. 8 is a schematic view of instruction flow in a software model of the present invention.

As mentioned earlier, the data supplied for asynchronous events may be different every time, even if the microprocessor executes the same codes over and over again. Turning briefly now to FIG. 7, to address this type of problem, analyzer memory 02 is also used to reconstruct hardware model 100's states on a second execution of the same code by hardware model 100. Analyzer memory 02 can thus be used to inject predetermined patterns that will force microprocessor 110 to duplicate the original conditions. Once that has occurred, software model 200 can be initialized with the same known data. This approach allows easy synchronization in a short time.

Returning now to FIG. 1a, in a preferred embodiment, system control software 510 is a computer program residing in host 500. Also in a preferred embodiment, multiple circular buffers 50 are included in analyzer memory 02. As will be apparent to those skilled in the art, the number of circular buffers 50 could be increased or decreased to suit the needs of the system under development.

Figure 9:
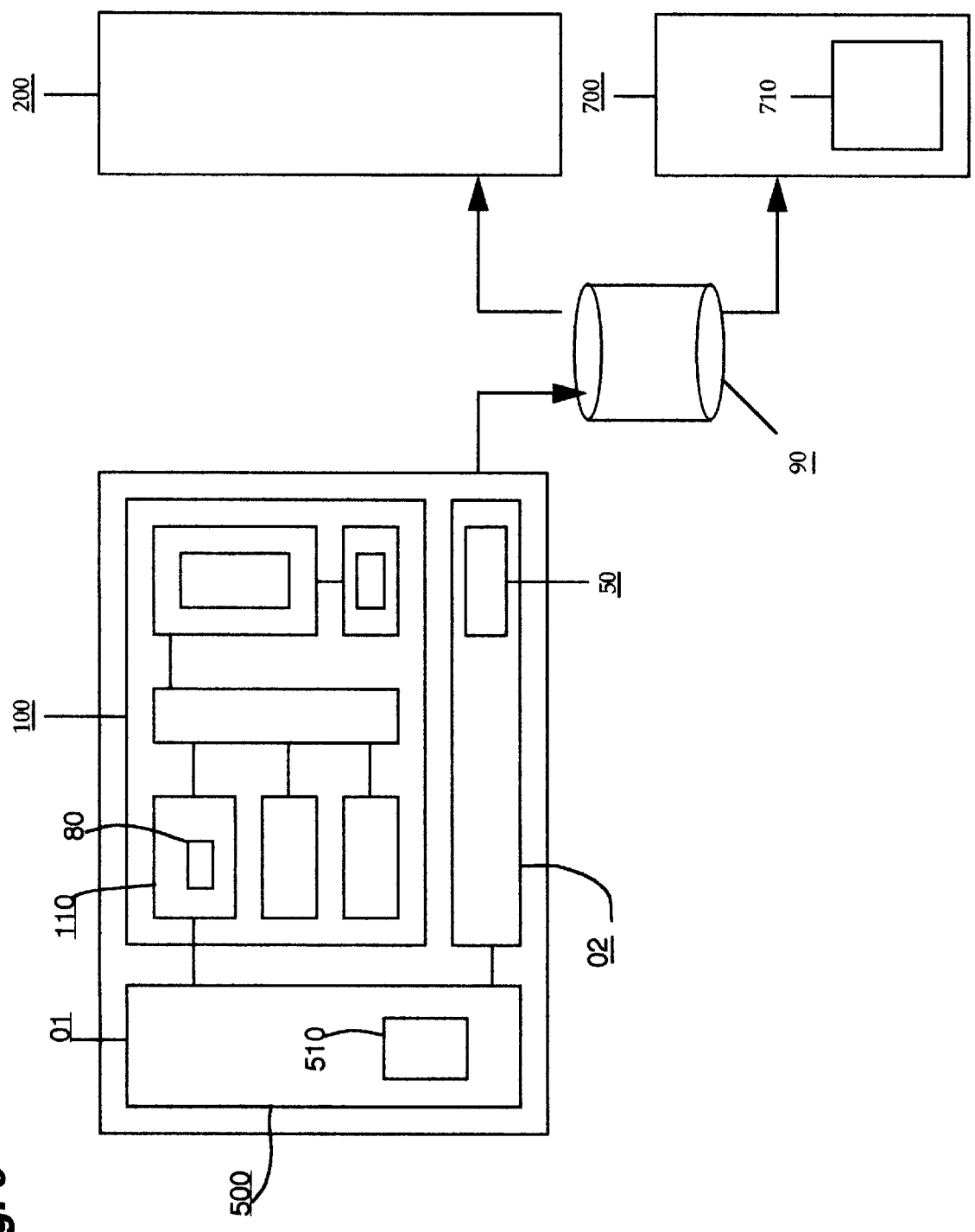
FIG. 9 is a schematic block diagram of test vector generation according to the method and apparatus of the present invention.

Another aspect of the present invention is that it provides a simple, fast method for generating test vectors. With reference now to FIG. 9, to generate test vectors using the present invention, the system designer would write a program 80 of diagnostic codes, in a higher level language, then compile program 80 on host 500, and download it to run in microprocessor 110. While program 80 executes, analyzer memory 02 stores the precise machine states for the inputs and outputs of the system continuously. The contents of analyzer memory 02 can then be stored on a storage device such as design data base 90 as a test vector file for use in running software model 200 or for use in a hardware tester for device test purposes.

When used with software model 200, the test vector files consists of a sequence of vectors, with some portions of each vector representing inputs to software model 200, and the rest of the vector representing expected outputs from software model 200 at that point. When software model 200 is executed with diagnostic program 80, the input portions of each vector are provided successively as inputs to software model 200, and the output produced by software model 200 are compared with the actual output states recorded in the vector for that point.

Similarly, when the completed design is produced as an FPSM 700 printed circuit board or as a FPSOS 800 chip, a hardware tester can be programmed to run either product to provide the input portions of each vector to the product at the appropriate point, and compare the outputs of either FPSM 700 or FPSOS 800 at that point, with the expected output state recorded in the test vector file on design control database 90. As can be seen, this approach can completely automate the generation of system test vectors, reducing a task that typically took four to six weeks, for a reasonably complex system to one that can be done in a few milliseconds, once the diagnostics are written.

Referring again to FIG. 7, it can be seen that the present invention accumulates processor events as programs are being executed in hardware model 100. An internal clock signal 16, generated by event detection logic 30, is used to time stamp events as they are recorded. As noted, these events are stored in circular buffers 50. If desired, this information can also be used by the system designers for performance analysis. For example, if the microprocessor under development has a new design for interrupt service, this feature of the present invention can provide actual timing data to verify whether the new interrupt service design is fast enough. As will be apparent to those skilled in the art, for performance analysis of a series of events, the system designer can simply save the contents of each circular buffer in a disk or in internal memory in host 500 for later analysis.

Software designers can also use performance data to optimize program code. If, for example, the performance data shows that application program 06 under development spends nearly 70% of its time executing a small section of code, repeatedly, the software designer can focus on that section and improve its speed of execution.

Figure 10:
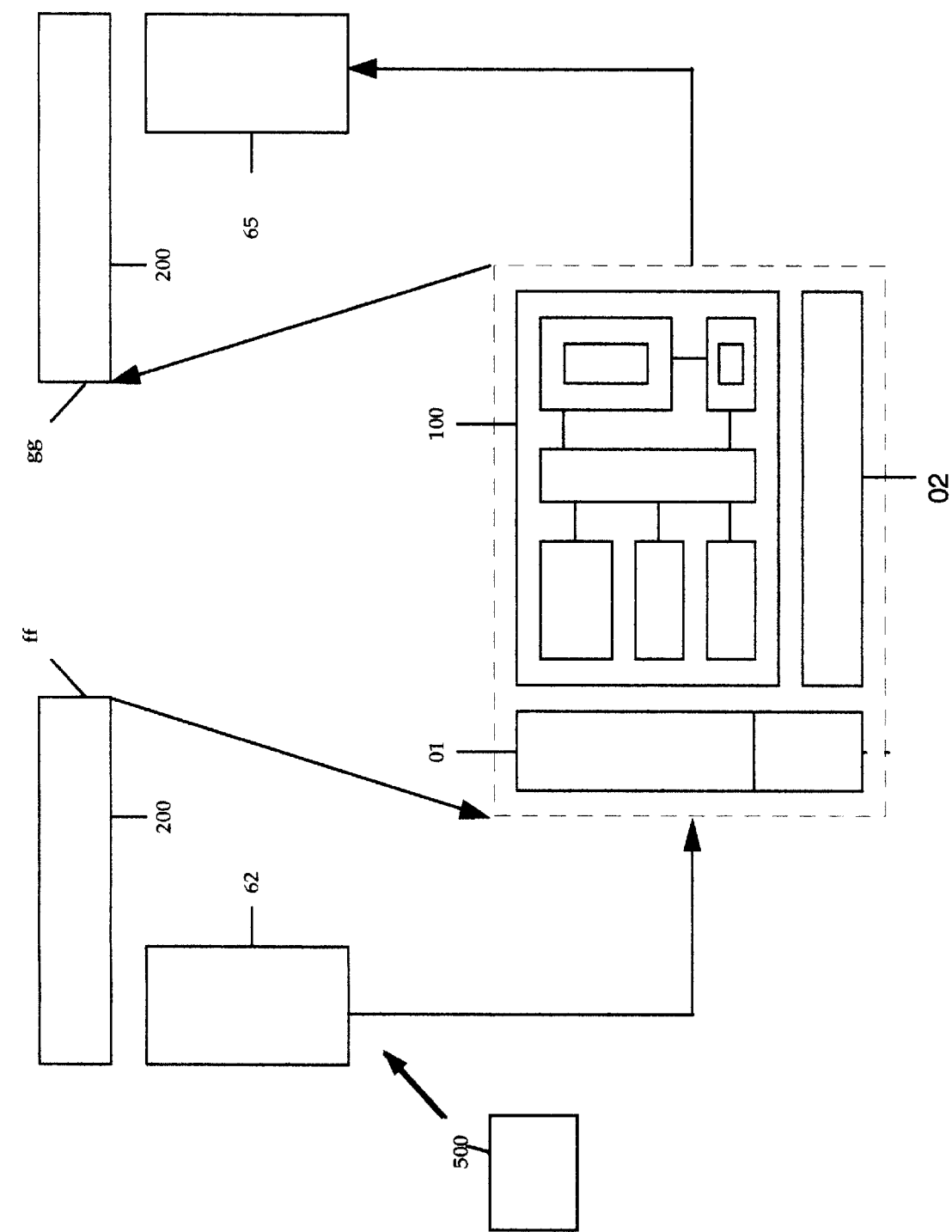
FIG. 10 is a block diagram of a hardware accelerator for a software model according to the method and apparatus of the present invention.

Another feature of the present invention is shown in FIG. 10. Here, hardware model 100 is shown used as a hardware accelerator for software model 200. As mentioned above, software simulation is very slow in nature, by comparison to hardware emulation. Therefore, one of the most difficult problems that a software model 200 must address is the speed of simulation, before it can address the ability to interface with real application software conditions. In a preferred embodiment, the present invention helps solve this problem by being able to act as a hardware accelerator to software model 200.

As shown in FIG. 10, software model 200 progresses until a stop ff point at which it requires the results from the execution of a block of code 62. At that point, software model 200, which is running under the control of host 500, stops processing until code 62 can be compiled, if necessary. Once it has been compiled, host 500 downloads it to hardware model 100, where it is executed and the results are stored in analyzer memory 02 as execution occurs. The contents of analyzer memory 02 at the end of such processing can be stored in a list 65 of input stimuli readable by software model 200. Once list 65 is ready, software model 200 can resume processing at restart point gg, using the contents of list 65 to initialize its view of the machine states and register contents. As can be seen, if the block of code 62, had been significantly long, it might have taken many minutes or even hours to simulate in software model 200. Using the accelerator approach, it may take only seconds or milliseconds to execute in hardware model 100. Considerable savings in development time can be realized this way.

The present invention also allows the user to recreate hardware execution states exactly for debugging purposes by injecting previously recorded patterns into hardware model 100. This can best be seen by referring back to FIG. 7. As shown there, each event that is recorded is also identified and time stamped in analyzer memory 02. During hardware development, it is crucial to be able to recreate exactly hardware execution states. However, as mentioned earlier, if the same hardware event, say a read command, which causes an interrupt when data is returned asynchronously, is executed twice in a row, the exact hardware states may vary each time, since real-time events are unpredictable. To eliminate this complexity when using the present invention in hardware debugging mode, the present invention allows a system designer to take the recorded data in analyzer memory 02 associated with the first read command, and use it to replace the contents of the interrupt resulting from the second read command, thus creating identical results. Controlling this variable helps the designer isolate the problem.

A variation of this can also be used to set up hypothetical scenarios for hardware model 100, or software model 200. Still in FIG. 7, analyzer memory 02 can be set to contain the desired system states in advance. At the appropriate event detection point, these predetermined states can be restored to create a "what if" situation for either hardware model 100 or software model 200. Thus, a scenario that is unlikely to occur in normal testing without undue effort, can be created and used to check out the system. Extreme system states or unusual error conditions are examples of the types of situations that might not occur in routine testing. These can now be created and injected into the model(s) to see what happens. This can also be done with the final product forms, FPSM 700 and FPSOS 800. That is, FPSM 700, for example, can be substituted for hardware model 100. Minianalyzer memory 702 can be used in the same way to create "what-if" situations for the printed circuit board version of the product or the chip version. This not only helps in field testing, but is useful for diagnostics once the system is in production.

Figure 11:
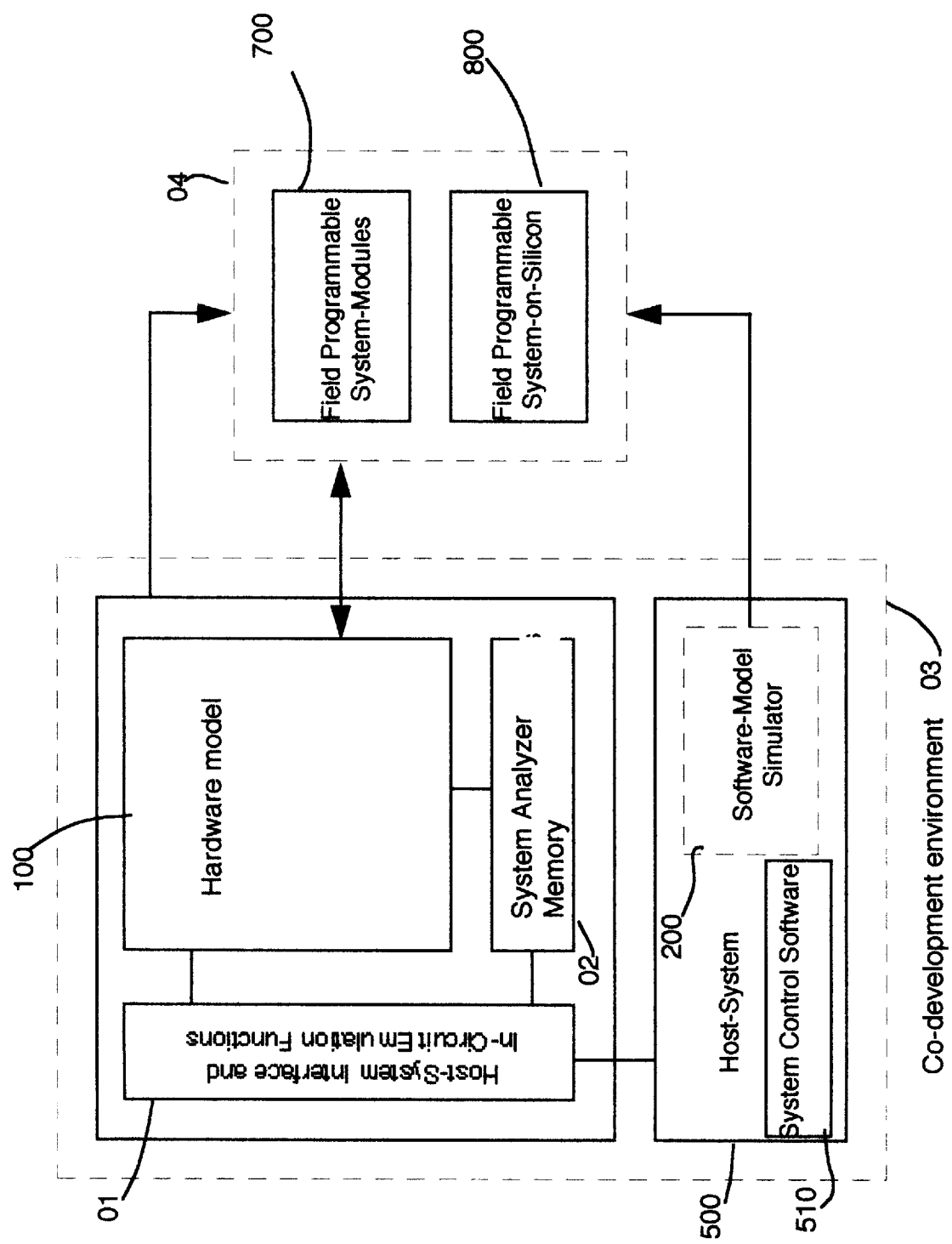
FIG. 11 is a block diagram of the various types of operation available in the cross-linked environment of the present invention.

Now referring to FIG. 11, it can be seen that the present invention allows the user to create a simulated software model 200, a real-time emulation of the target system via hardware model 100, as well as combined co-development environment 03 which uses both hardware model 100 and software model 200 together. This means that software model 200 can model internal states, internal execution states of microprocessors, peripherals, and custom user logic, with both forwards and backwards execution, based on supplied HDL netlists. Hardware model 100 executes in real-time, and hence can be used for in-system verification, with the application software running at real-time under real application conditions. Hardware model 100 can do external state modeling, rapid-turn prototyping, systems analysis, automatic generation of system test vectors and HDL input stimulus, as well as allow the designer to trace execution history. Co-development environment 03, the synchronized combination of the two models according to the method and apparatus of the present invention, allows the designer to debug both hardware and software running together, perform system analysis functions, generate test vectors automatically, do performance analysis, etc. All of these functions can be done under the control of host 500 running system control software 510, so that system control software 510 also manages tasks in any system, controls the software and hardware debugging functions and the analyzer memory functions as well to direct flow control. This permits co-development environment 03 to be operated in four different modes: real-time emulation of the system under development, system simulation with software model 200, semi-real-time hardware emulation mode in preparation for synchronizing mode, and finally, debugging mode, when both hardware model 100 and software model 200 have been synchronized and are executed together.

Figure 12:
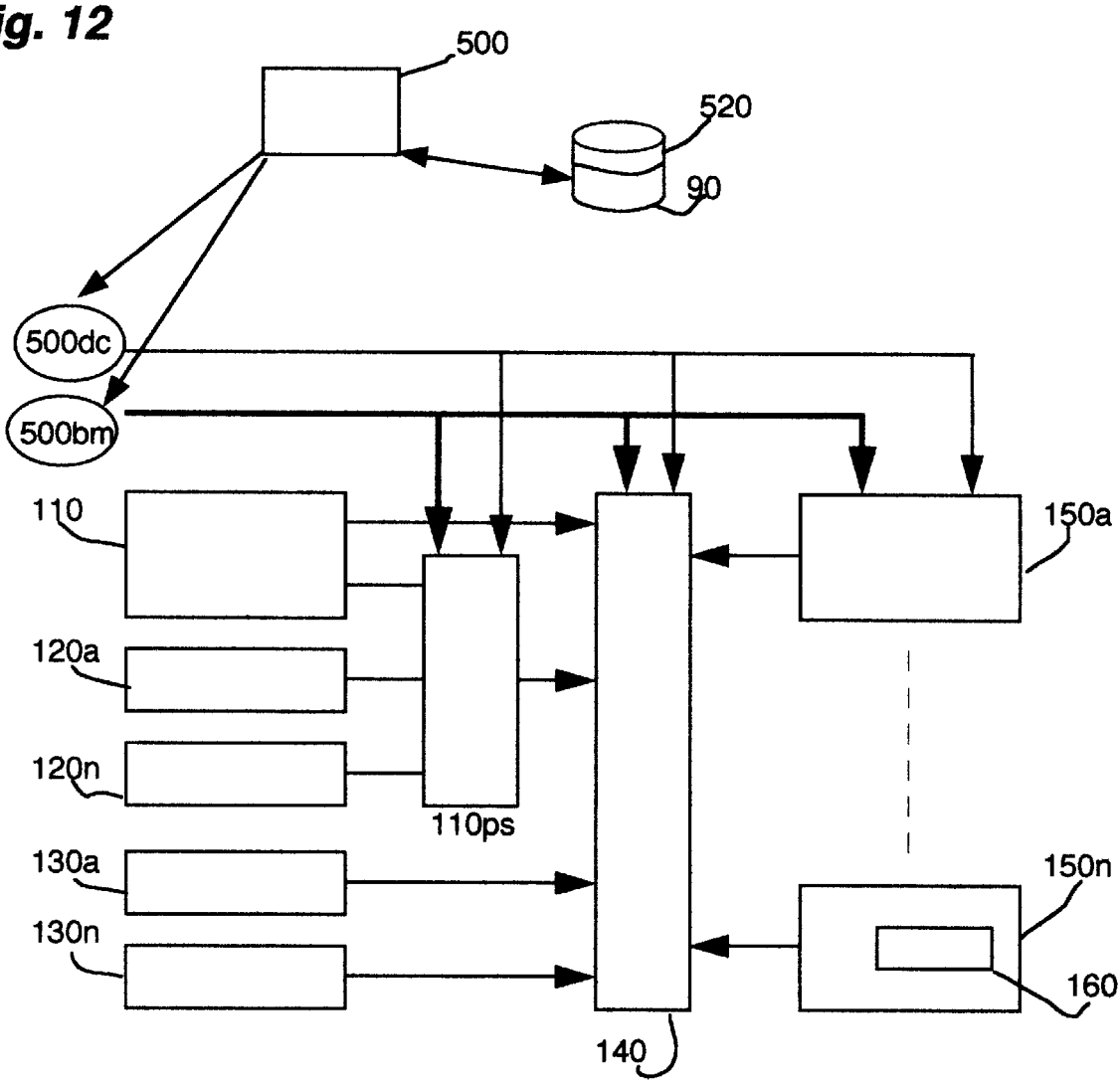
FIG. 12 is a schematic diagram of the present invention showing the downloading of bit maps for configuring a hardware model.

Turning now to FIG. 12, a schematic drawing shows how hardware model 100 can be dynamically re-configured for rapid-turn system prototyping. Since every user will have different user specific custom user logic 160, a universal platform is provided as part of hardware model 100, by which a user's system can be dynamically configured and reconfigured. Typically, user logic design is done on a host system first, using various commercially available design software packages known in the art. In a preferred embodiment the resulting design file is transformed to generate an EDIF (Electronic Data Interchange Format) file. From the EDIF file, a bit map, also known as a fuse map is generated by the present invention to program field programmable devices (FPD's) 150. Once the bit map has been generated, it can be downloaded from host 500, as shown in FIG. 12. Line 500dc represents host 500's download command. Line 500bm is the bit map data. As is shown in FIG. 12, data from the bit map is transmitted to peripheral select 110ps, system interconnect 140, and FPD's 150a through 150n, where n represents the number of FPD's 150 in the user's system. Downloading of the bit map file to configure hardware model 100 can be done in less than a minute.

The dynamic configuration and reconfiguration of hardware model 100 is achieved according to the method and apparatus of the present invention by creating a connectivity file on host 500. A connectivity file identifies which peripherals are selected for the model, and how the inputs and outputs of the microprocessor, peripherals, and FPD's are connected. This too, becomes a bit map that can be downloaded to field programmable interconnect devices 140 in hardware model 100.

Now referring to FIG. 4, an overview of the event detection logic of system analyzer 30 is depicted. As is shown, microprocessor 110 may generate any of three types of signals: system events 110se, exception vectors 110ev, and control signals 110sc. When system events 110se such as load, store to internal cache or store to disk cache commands are detected by event detection logic 30, they are sent to analyzer memory 02 for recording, along with a time stamp and event identifier, and machine state information. Similarly, exception vectors 110ev that indicate machines states such as cold or soft reset, non-maskable interrupts (NMI), cache error, translation look-aside buffer (TLB) refill, and others can also be detected and recorded in analyzer memory 02 with time stamps and event identifiers, etc. In the same way, control signals 110sc such as system command, system address data, and other system control signals can be detected and recorded, too. In a preferred embodiment event detection logic 30 is also responsive to signals from host 500, such as host-generated event 500g, which might activate controls in the co-development system.

Figure 5:
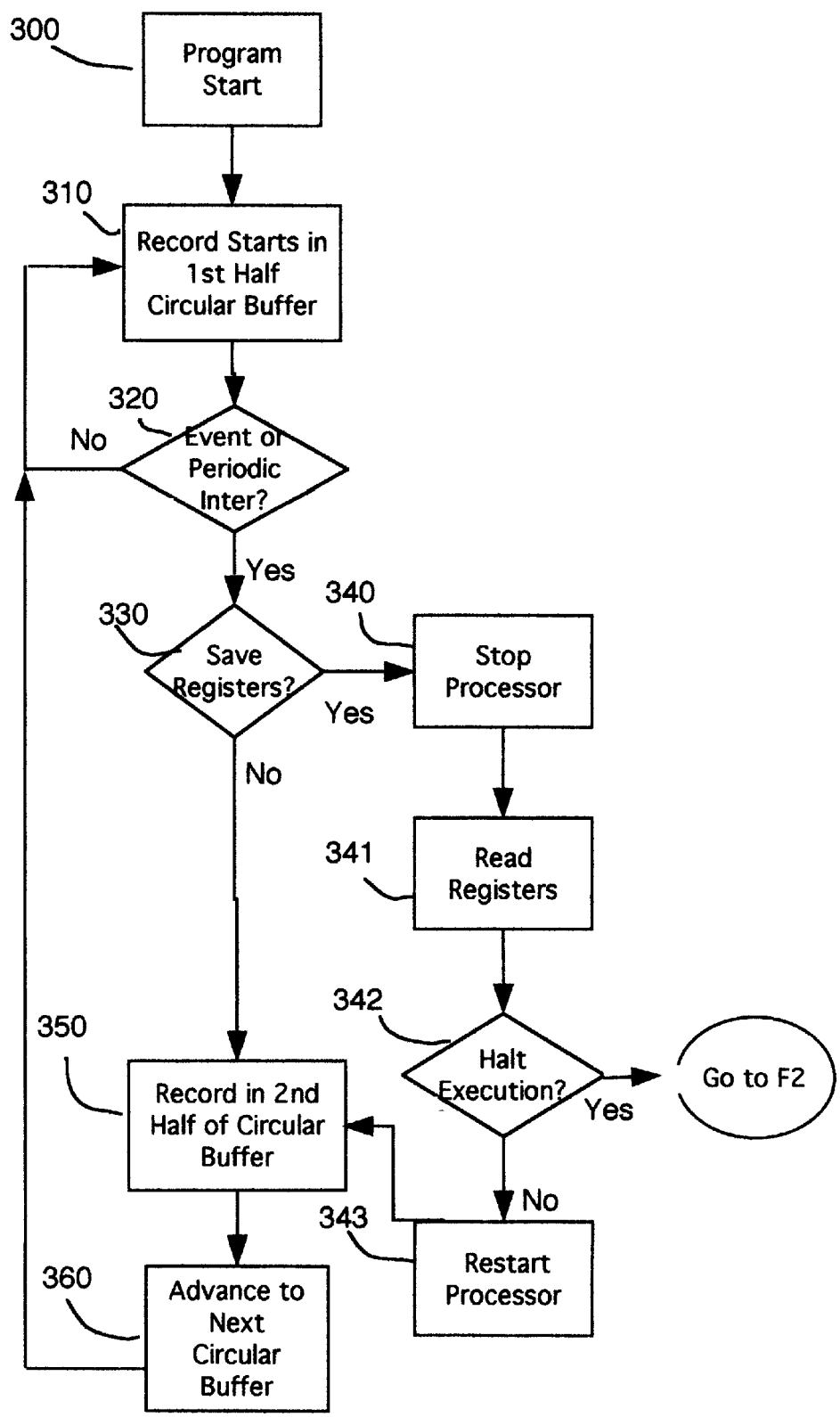
FIG. 5 is a flow diagram of the recording done by the analyzer memory of the present invention.
Figure 6:
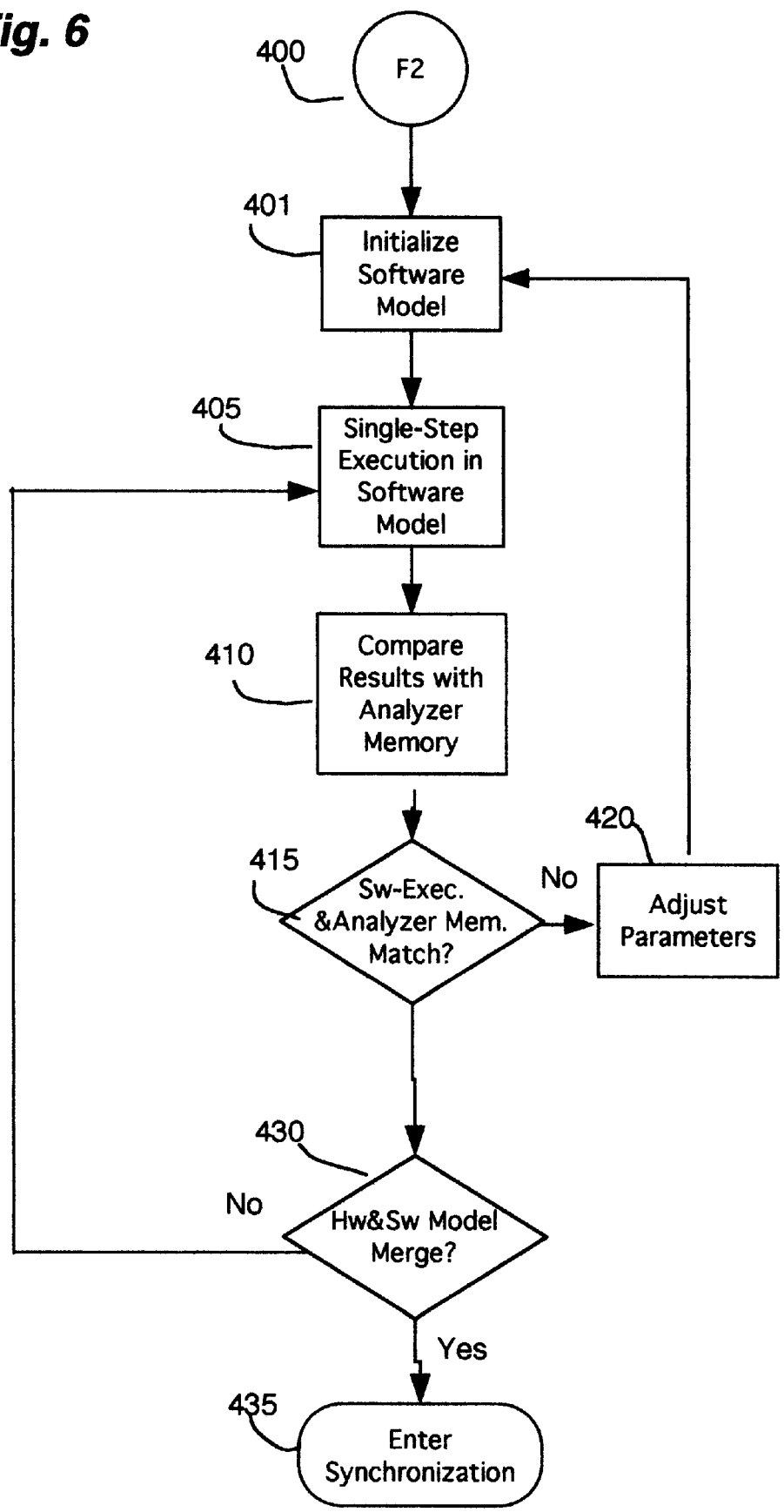
FIG. 6 is a flow diagram of the event detection logic and synchronization process of the present invention.

A more detailed view of the processing done by event detection logic 30 for event detection and synchronization is shown in FIGS. 5 and 6. Turning first to FIG. 5, at step 300, execution of application program 06 by microprocessor 110 starts. At this time system control software 510 selects the mode of operation as specified by the user, selects the circular buffer 50 size, programs event detection logic 30 as specified by the user and allows microprocessor 110 to begin executing. The hardware model then enters execution state at step 310, where system signals are recorded in analyzer memory 02 in a circular buffer 50. At each cycle of execution, event detection logic 30, at decision block 320 compares the current state of the system to the preselected events, to see if such an event or periodic interrupt has occurred. If no event or interrupt has occurred, the system continues executing and recording at step 310.

Still in FIG. 5, if an event of the specified type has occurred, the event detection logic 30 records the event and time stamp in analyzer memory 02. Event detection logic 30 also determines at step 330 if the processor registers should be saved. If yes, event detection logic 30 interrupts microprocessor 110 at step 340, reads the registers and saves them, or at the user's option, transfers them to host 500 at step 341. In a preferred embodiment, event detection logic 30 next checks the event type at step 342 to see if execution should be halted. If yes, event detection logic 30 returns control of the system to system control software 510. If execution is not to be halted, microprocessor 510 is allowed to restart at step 343. Control then passes to step 350, where recording continues. At step 350, the second half of circular buffer 50 is filled and analyzer memory 02 is advanced to the next circular buffer at step 360. From this point, processing returns to step 310, which continues to record machine states in the first half of this next circular buffer 50, until the next event or periodic interrupt occurs.

This method of event handling allows the capture of events which are separated by comparatively long periods of time, or if a periodic interrupt is programmed with sufficient frequency, to capture all machine states and periodic dumps of registers with no gaps in recording. This latter method is used by the present invention in the semi-real-time hardware emulation mode in preparation for synchronizing.

Now referring to FIG. 6, the synchronization process of the present invention is shown in more detail. At step 400, system control software 510 initializes software model 200 with the register values and machine states read in at the last register dump event, prior to the halt of hardware model 100. If there are parameters which need to be set in software model 200, but are not available from the hardware, system control software 510 will initialize these parameters with a "best guess" as to their proper state. Next, at step 405, system control software 510 will single-step software model 200 for one machine state. At step 410, the results of the previous step are compared with the machine states saved in circular buffer 50 of analyzer memory 02, following the last register dump event prior to the halt of hardware model 100. At step 415, if the results match, system control software 510 next checks at step 430 to see if software model 200's state matches that of hardware model 100 at the point where hardware model 100 was halted. If software model 200 and hardware model 100 are at the same point, the co-development environment has entered the synchronized state. If software model 200's state and hardware model 100's state as recorded in analyzer memory 02 agree, but software model 200 has not reached the point where hardware model 100 halted, system control software 510 returns to step 405 to execute another step, until the halt point is reached. If at some point in stepping software model 200 through from the last register dump before hardware halt, the results from the software model 200's step do not agree with those recorded in analyzer memory 02, software model 200 and hardware model 100 are in disagreement. In order to place software model 200 in synchronization, at step 420 one or more synchronization strategies can be executed by system control software 510 as specified by the user. These strategies include, but are not limited to, returning to the last register dump event prior to hardware halt, re-initializing software model 200 with adjusted parameters, and restarting software model 200; returning to a previous register dump event, and executing software model 200 forward from that point; continuing with the current parameters to see if transitory disagreement can be ignored and synchronization reached at the point of hardware halt; or, in the worst case, returning to the reset point and executing software model 200 forward from that point, either in synchronization with hardware model 100 using vectors stored in analyzer memory 02 or by using hardware model 100 as a hardware accelerator for software model 200, or a combination of both these latter methods.

Once hardware model 100 and software model 200 have been synchronized, debugging of the system can continue in the synchronized mode. When debugging is completed, final system integration can be done, producing design data base 90, which contains custom user logic files, system interconnect connectivity files, system test vectors and HDL simulation input stimulus files. This data base now represents a design that has been functionally simulated, emulated in a real-application environment and verified with real application software 06 running at real-time.

Design data base 90 can now be used to create FPSM 700. Returning now to FIG. 1, FPSM 700 is a small printed circuit board containing the rapid-turn prototype hardware model 100 of co-development environment 03. Using the same design data base 90 that has been generated during system integration and emulation, FPSM 700 can be programmed, making it an end product. Multiple units can be produced for field testing or even production purposes, if desired.

As is shown in FIG. 1, FPSM 700 has a small size mini-analyzer memory 702 and host interface logic 701. These features enable FPSM 700 to be used in co-development environment 03, so that real-time emulation at high speeds, system function fine tuning, modifications and field upgrades can be done using the debugging aids of co-development environment 03.

Still in FIG. 1, FPSOS 800 can also be the product in final form, as implemented on a single chip. It, too, uses design data base 90 generated in co-development environment 03. Since the physical characteristics of the chip are different from a system implementation on a printed circuit board, design data base 90 may be re-simulated using software model 200 in connection with FPSOS 800 and running these under the control of host 500, to fit the design for the field programmable system on silicon. In most cases, a re-simulation of design data base 90 would be necessary for the silicon version because a field programmable system on silicon has smaller loading factors which will affect the timing of the system to be implemented.

The main purpose of FPSOS 800 is to implement the new design in final product form for high volume production. However, it also has another very important use. When system operating frequencies increase beyond approximately 60 Megahertz, real-time emulation of the system with standard off the shelf emulators becomes a difficult task. However, FPSOS 800 can be operated well beyond this limitation. Therefore, once the system is implemented on an FPSOS 800 chip, much higher speed real-time emulation is possible. For this reason, a debugging function is provided in host interface logic 801 of FPSOS 800. Internal execution states can be read out to host 500 from FPSOS 800. This data can be used by software model 200 running under control of host 500, to duplicate the execution states of FPSOS 800 and analyze the state of the execution.

When either FPSM 700 or FPSOS 800 are used for emulation purposes, software model 200 is used to replicate the internal execution states of the hardware. Thus, it can be seen that co-development environment 03 allows FPSM 700 and FPSOS 800 to be cross-linked to provide system development and system implementation functions in a unified environment. Hardware model 100, FPSM 700 and FPSOS 800 can replace one another from one stage to the next, making these three elements completely interchangeable.

Figure 13:
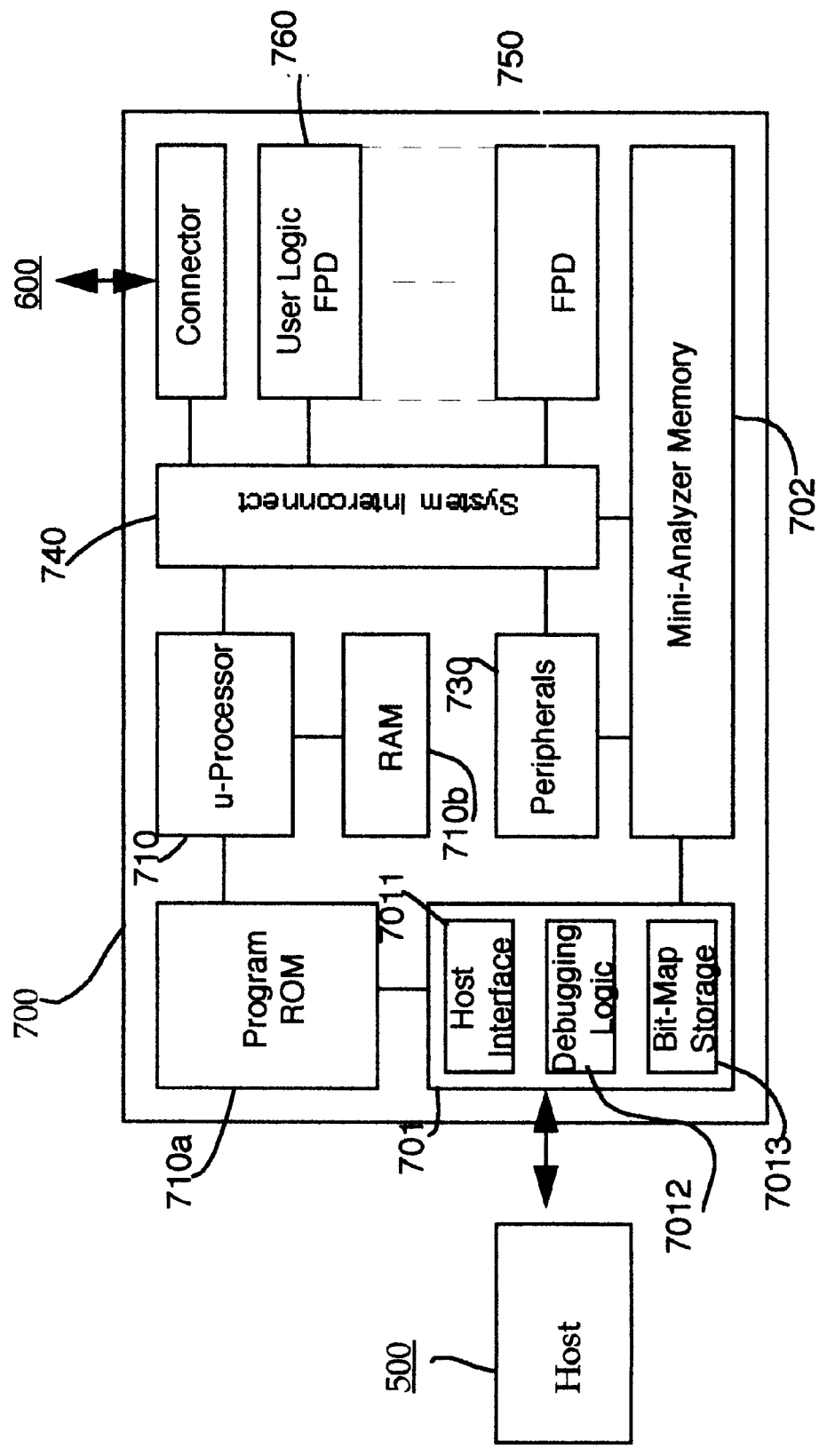
FIG. 13 is a schematic diagram of a field programmable system module according to the method and apparatus of the present invention.

Turning now to FIG. 13, field programmable system module FPSM 700 is shown in more detail. In a preferred embodiment, FPSM 700 includes a microcontroller or microprocessor 710, non-volatile field programmable read-only memory (ROM) 710a, random access memory RAM 710b, for data peripherals 730 and field programmable devices FPD's 150, such as those made by AT&T, Xilinx, and many others, for mapping custom user logic 160, mini-analyzer memory 702 and host system interface 701.

As shown in FIG. 13, FPSM 700's host system interface 701 provides a link to host 500. In a preferred embodiment, it also contains non-volatile memory 7013 for storing bit-maps to program FPD's 750 and system interconnect 740 . On power up, non-volatile memory 7013 containing bit maps is read and used to program the system by debugging logic 7012. Debugging logic 7012 also provides debugging features in general for FPSM 700.

During the initial programming of FPSM 700, host system interface 701 is used to down load the bit-map files from host 500 and design data base 90 to non-volatile memory 7013. Host system interface 701 also initiates the programming of the system module.

Still in FIG. 13, mini-analyzer memory 702 is an array of memory which stores machine states, in the same manner as described for analyzer memory 02, above. The contents of mini-analyzer memory 702 can be read out through host system interface 701 to host 500. This data can then be used by software model 200 to analyze execution states of FPSM 700. This capability enables the use of FPSM 700 for remote site debugging, change of logic, change of system configuration, and for fine tuning of system functions, as well as the use of FPSM 700 for real-time emulation. This same data gathered from FPSM 700 can be transferred into co-development environment 03 for comprehensive analysis if needed.

Figure 14:
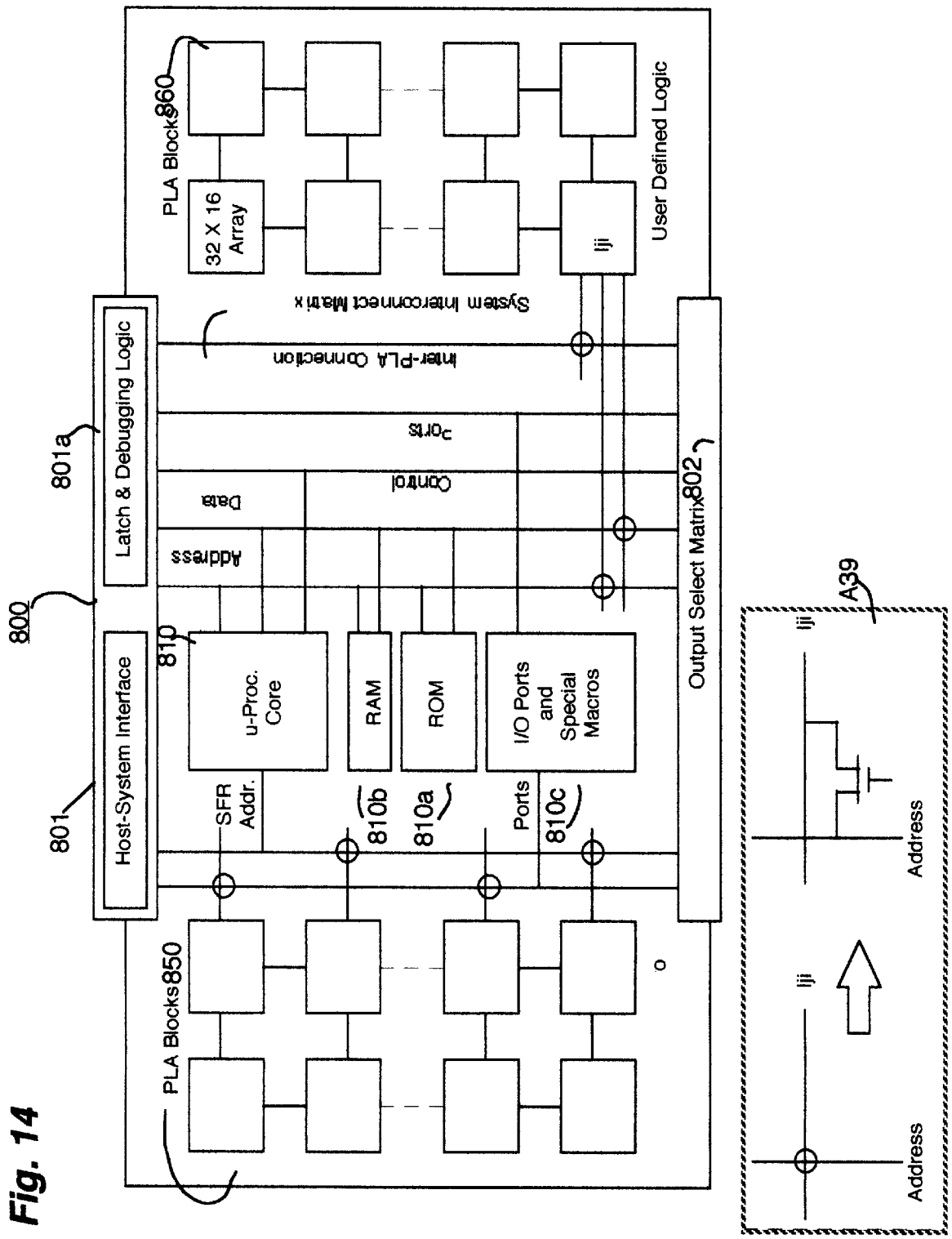
FIG. 14 is a block diagram of a field programmable system on silicon according to the method and apparatus of the present invention, showing address connections.

Now turning to FIG. 14, a field programmable system on silicon FPSOS 800 chip is shown. FPSOS 800 contains on-chip resources to enable system integration on a single chip that is field programmable.

In a preferred embodiment, FPSOS 800 has fixed functional blocks as hardware macros. These are : microprocessor core 810, random access memory RAM 810b, for data, and program memory ROM 810a, together with special function macros and ports 810c. As will be apparent to those skilled in the art, the sizes of RAM 810b and ROM 810a may vary with the application. The selection of special function macros and ports 810c will depend on the target applications. For example, one set might be configured for analog to digital converters, another for liquid crystal display drivers, etc.

Still in FIG. 14, in a preferred embodiment programmable logic array (PLA) blocks 860 are used for custom user logic and PLA blocks 850 are used for field programmable peripheral devices. System interconnect matrix 840 is a ROM-like array used to interconnect any signals to any other functional blocks in the chip. Output select matrix 802 is also a ROM-like array that receives all available signals internal to the chip from system interconnect matrix 840. Output select matrix 802 is used to select internal signals to output to the external pin of FPSOS 800. Host system interface 801 is a programming and communication port to host 500.

As with FPSM 700, design data base 90 is used to create FPSOS 800. In the case of FPSOS 800, a functionally verified netlist has been generated in co-development environment 03, to describe custom user logic 860, peripheral functional macros 850 and system interconnect matrix 840.

Still in FIG. 14, connecting points A39 show how system interconnect matrix 840 is implemented in one preferred embodiment. The vertical column labeled as "address" crosses over the horizontal row labeled as "Iji" denoting j-th block i-th input signal. When no "circle" appears at the crossing point, the two signals do not make connections. They are simply crossing over. When a "circle" appears, the two signals make connections. When the two signals make connections, an active transistor is programmed to turn on.

In a preferred embodiment, the transistors used to make connections are commonly available electrically programmable transistors, known as EPROM, EEPROM or flash memory cells. During programming, when the programming voltage is applied to the gate terminal of a transistor, it traps charges under the gate, making the transistor turned on. These trapped charges remain under the gate after power has been turned off, making a non-volatile connection. The charges under the gate of a transistor can be removed electrically. Therefore, the programming and re-programming can be done a number of times as specified by the electrically programmable memory cell's physical characteristics. One-Time Programmable (hence the name OTP) storage cells use anti-fuse, that can be burned during programming, making one-time programming connections or disconnections. FPSOS 800 can make use of any of the above types of available technologies for its implementation. As will be apparent to those skilled in the art, future technologies that permit programming or re-programming can be used as well.

Still in FIG. 14, in system interconnect matrix 840, PLA blocks 860 used for mapping custom user logic, can tap into any line designated as "address" "Data," "Control Signals," or "inter-PLA Connection" by turning on or off the connecting transistors at the crossing junction. System interconnect matrix 840 forms a ROM-like structure, with a number of vertical lines and horizontal lines crossing each other, with programmable transistors at each crossing junction. Once the connecting transistor is turned on, the signal flow can be in either direction, making bi-directional connections. Thus, this simple and straightforward structure simplifies system logic and interconnect programming.

Output select matrix 802 has the same structure as system interconnect matrix 840. Output select matrix 802 receives inputs from system interconnect matrix 840. Therefore, any signals of interest can be brought out, external to FPSOS 800 by programming and re-programming of output select matrix 802. Host interface logic 801 has a data path structure similar to that shown in FIG. 12, to allow the programming of PLA Block 860, PLA Block 850, system interconnect matrix 840 and output select matrix 802, and so on.

Figure 2:
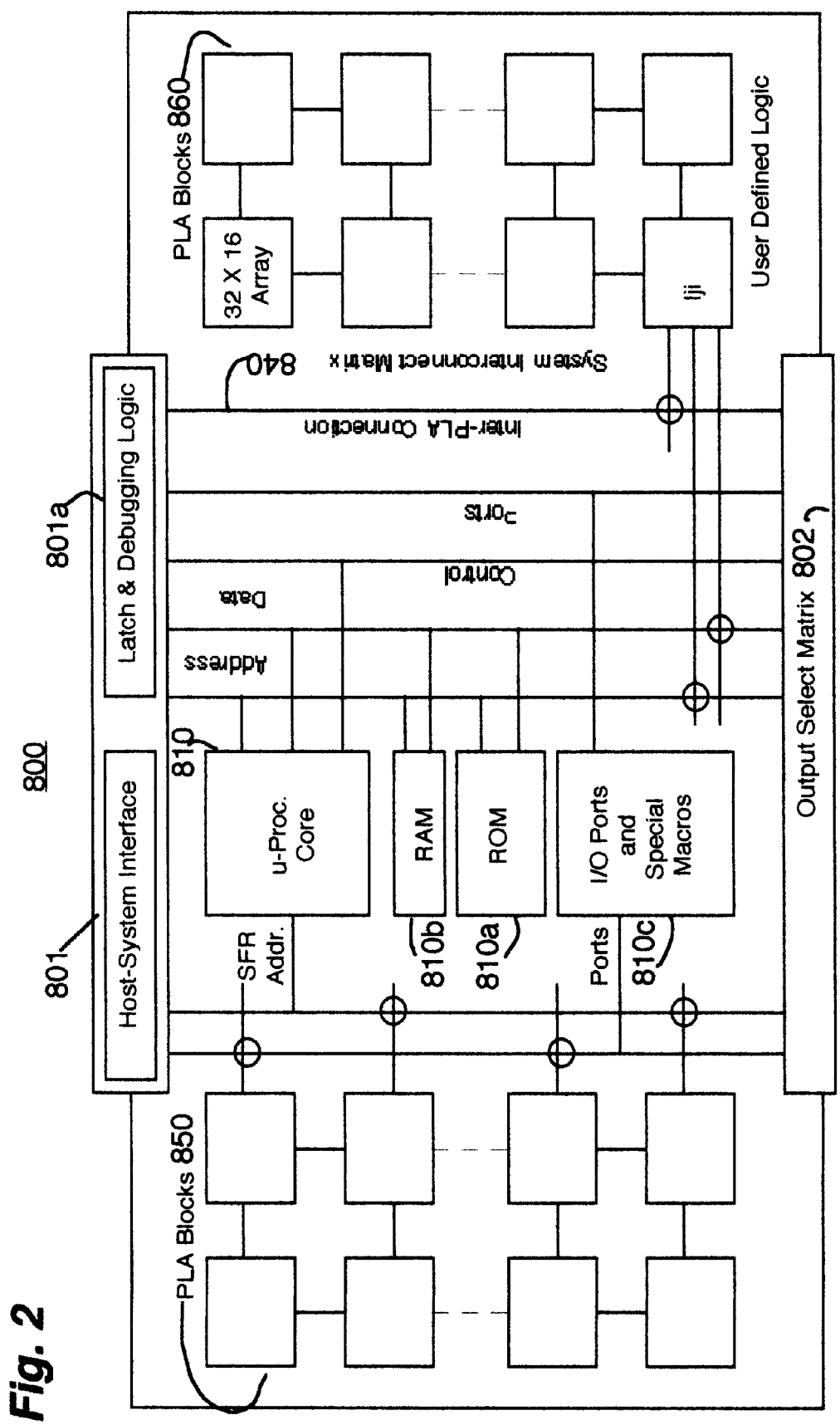
FIG. 2 is a schematic block diagram of a field programmable system on silicon according to the method and apparatus of the present invention.

Internal signal latch and debugging logic 801a, of FIG. 2, provides debugging features for FPSOS 800. This permits internal state information to be latched at the point where examination and analysis are required. The contents of internal signal latch and debugging logic 801a can be read through a JTAG chain (known in the art) to host 500. In addition, internal signal latch and debugging logic 801a has, in a preferred embodiment, the capability to start, stop, read internal execution information, single-step, and resume execution. Thus, it can be seen that software model 200 can use the internal execution state information read from FPSOS 800 to duplicate the execution states for further analysis.

This internal signal latch and debugging logic 801a also enables use of FPSOS 800 in remote site debugging, change of logic, change of system configuration, and for fine tuning of the system functions, as well as real-time emulation. When FPSOS 800 is used instead of the rapid-turn prototyper of hardware model 100, higher speed real-time emulation can be achieved, with all the system analysis functions offered by the co-development environment 03.

Figure 15:
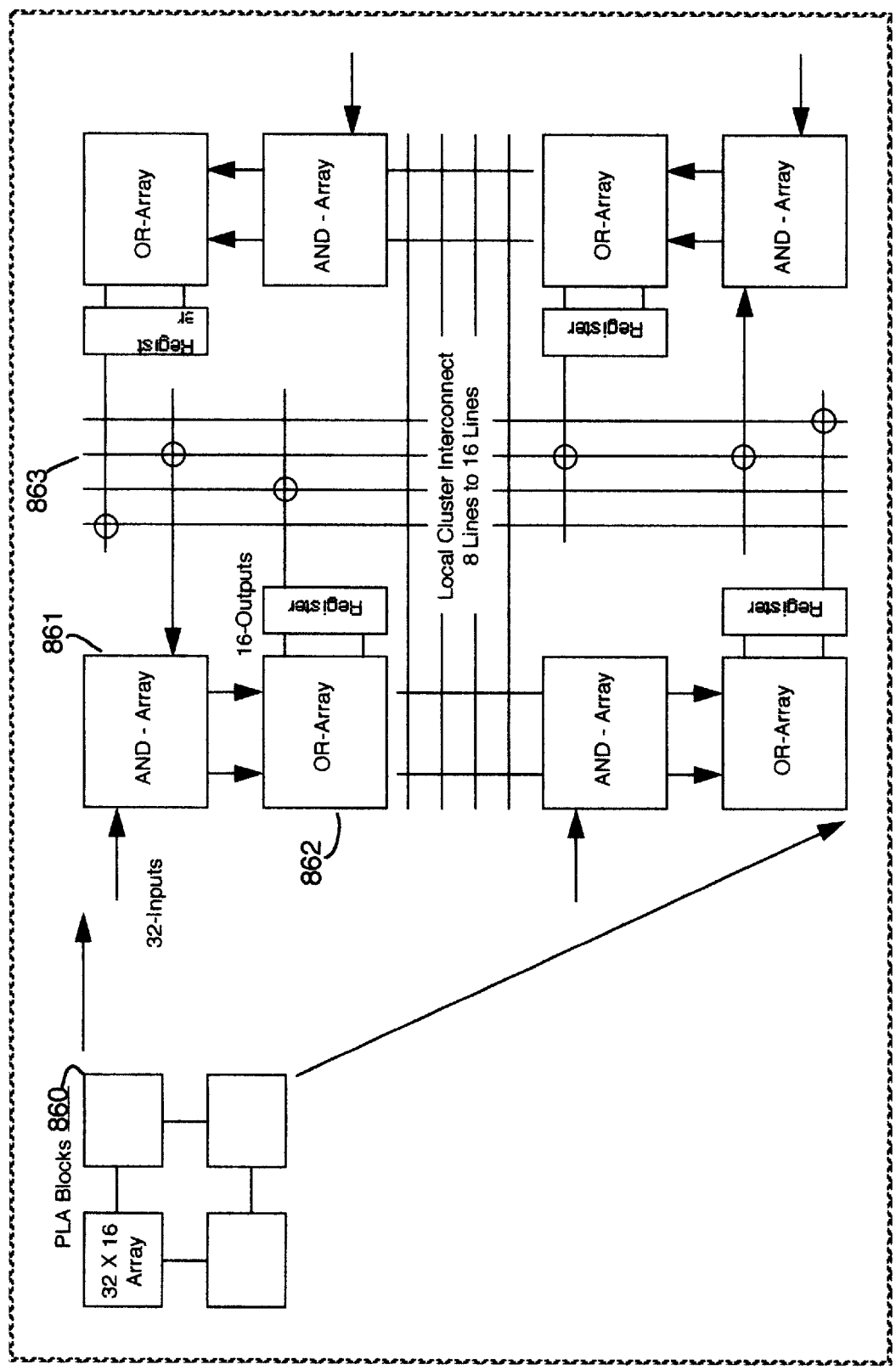
FIG. 15 is a block diagram of the field programmable custom user logic of a field programmable system on silicon according to the method and apparatus of the present invention.

FIG. 15 is a detailed diagram of PLA blocks 860 used for mapping custom user logic. It includes AND-array 861 and OR-array 862 which are connected to local cluster interconnect array 863. Both AND array 861 and OR-array 862 are programmable arrays, where the AND-array performs logical AND functions while the OR-array performs logical OR functions. Local cluster interconnect 863 makes connections inside PLA block 860.

Still in FIG. 15, it is generally true that a self-contained functional block has close communication with adjacent blocks before it is required to communicate with other blocks further away. To provide efficient routing of these communicating signals, local cluster interconnect 863 is provided within the array so that self-contained functions can be implemented without going outside of the cluster. Local cluster interconnect 863 has the same structure as system interconnect matrix 840, shown in FIG. 14.

Figure 16:
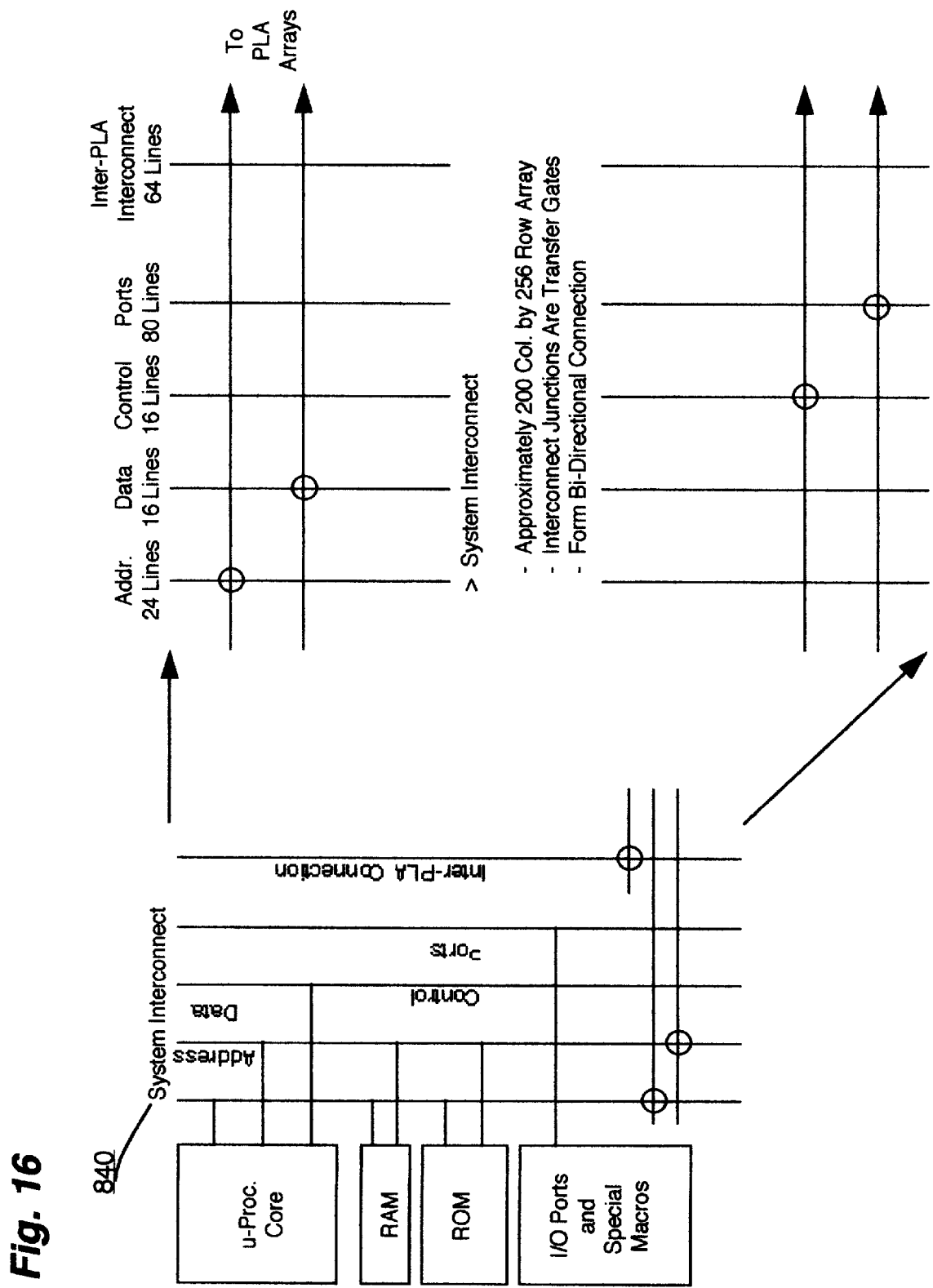
FIG. 16 is a block diagram of the field programmable system interconnect portion of a field programmable system on silicon according to the method and apparatus of the present invention.
Figure 17:
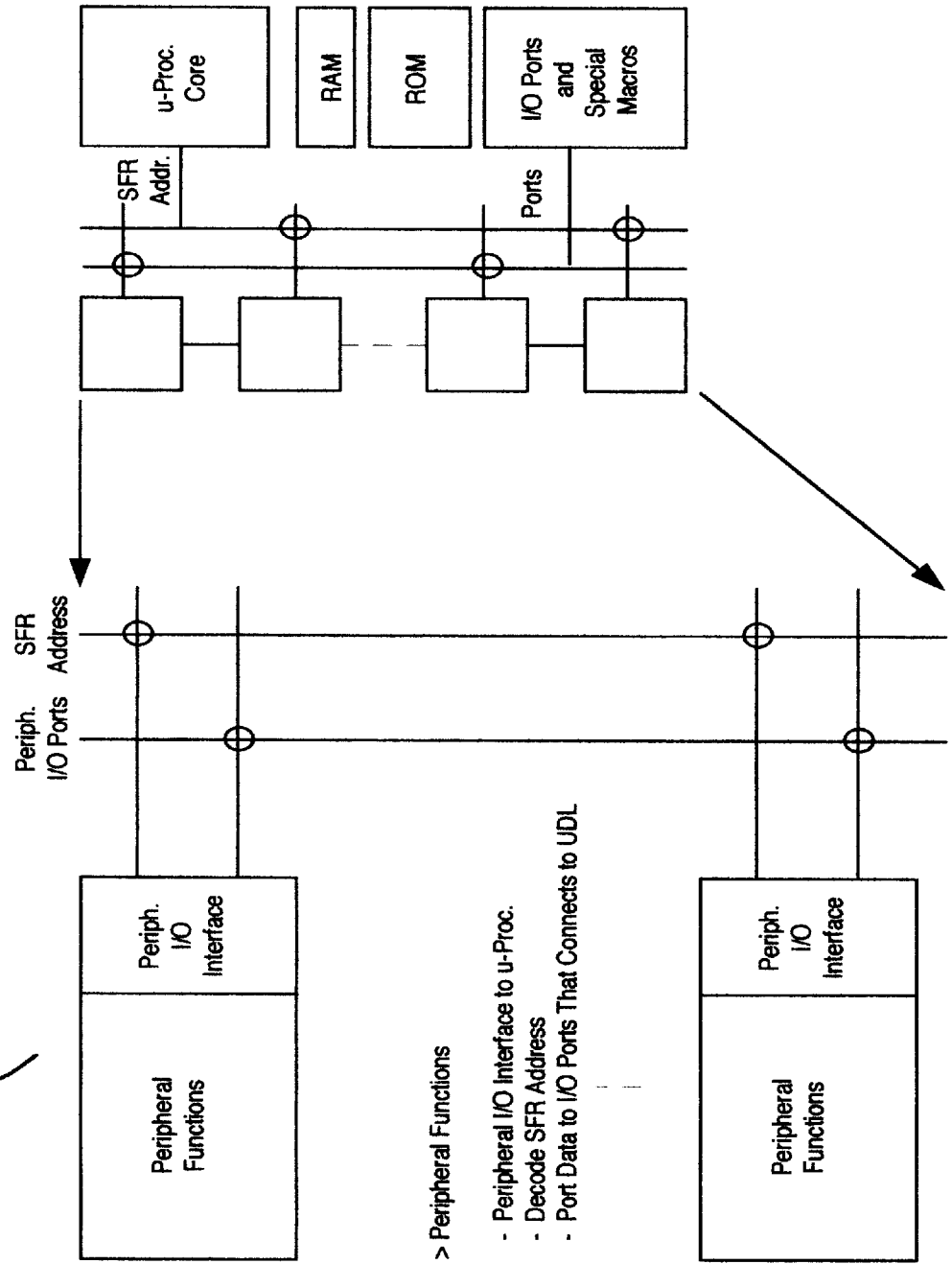
FIG. 17 is a block diagram of the field programmable peripheral and microprocessor logic of a field programmable system on silicon according to the method and apparatus of the present invention.

FIG. 16 is a detailed diagram of system interconnect matrix 840. FIG. 17 is a detailed diagram of PLA Blocks 850, used for mapping peripheral functions. Each processor typically has a unique method of communicating with its peripheral functional blocks, hence processor specific functions are also mapped as shown in FIG. 17.

For example, a processor uses a Special Function Register (SFR) to identify the particular internal peripheral resource with which it needs to communicate. The necessary registers and logic must be mapped according to the method of communication that the particular processor under development uses.

It should be noted that FPSOS 800 may be implemented using fixed functional block peripherals, or as shown in FIG. 17, with PLA Block 850. When peripherals are implemented using programmable logic arrays, this provides the added flexibility of commercially available logic functions for the user.

In embodiments shown in the Figures, components such as rapid turn prototypers as provided by I-Cube, Inc., (models IQ-160 and IQ320)'s Field Programmable Interconnect Devices "FPIDS") and Quality Semiconductor's Quick Switch Products QS3390, etc., can be used for emulating system interconnect 140 in hardware model 110, while a number of field programmable devices for user logic and control logic are available such as Lattice Semiconductor's ISP LSI3256 Programmable Logic Device, Lucent Technologies' Orca FPGAs devices, various off-the-shelf latches and control logic, and Alliance Corporation, Toshiba Corporation, NEC Corporation and others' static memory devices.

As will be apparent to those skilled in the art, host 500 can be any of a number of computers, mini-computers, personal computers and so on, capable of controlling hardware model 100 and software model 200. Similarly, while system control software 510 is embodied in software in a preferred embodiment, those skilled in the art appreciate that it, too, could be implemented in firmware, or programmable logic arrays or similar types of circuitry. Those skilled in the art will appreciate that the embodiments described above are illustrative only and that other systems in the spirit of the teachings herein fall within the scope of the invention.

What is claimed is:

1. An apparatus for providing a cross-linked development and deployment environment for electronic design automation of a system under development comprising:

a host computer having a processor and attached peripheral devices;

system control software executing in the host computer, the system control software having the ability to control synchronization;

a hardware model using actual hardware components for emulating the system under development and in communication with the host computer, the hardware model having a plurality of programmable components and being controlled by the system control software;

a software model simulating the system under development and structured to mirror the hardware model, the software model executing under the control of the host computer and the system control software;

an analyzer memory for recording machine states during execution of the hardware model, the analyzer memory being in communication with the hardware model and the host computer for synchronization with the software model;

event detection logic capable of detecting predetermined types of events occurring in the hardware model for synchronization purposes; and a design database for storing the results recorded as the models are exercised, synchronized, and analyzed under the control of the host computer so that files can be created to program a field programmable final product for deployment.

2. The apparatus of claim 1, wherein the analyzer memory further comprises at least one circular buffer of user selectable size for recording state information such as event identifier, register contents and state indicators during the execution of the hardware model.

3. The apparatus of claim 2, wherein the event detection logic further comprises an internal clock signal source for use in creating a time stamp when recording events in the circular buffer.

4. The apparatus of claim 3, wherein the system control software further comprises a test vector generator for reading the state information recorded in the circular buffer and storing it into the design database.

5. The apparatus of claim 4, wherein the system control software further comprises synchronization logic for reading state information from the design database and inserting it into the software model to enable it to begin execution at a specified state, thereby allowing the hardware model to act as an accelerator for the software model.

6. The apparatus of claim 2, wherein the analyzer memory can be set with predetermined states in advance of execution to create a particular test case.

7. The apparatus of claim 1, wherein the host computer further comprises a connectivity file stored therein which identifies the structure of the hardware model and enables the hardware model to be reconfigured.

8. The apparatus of claim 7, wherein the hardware model can be reconfigured to do rapid-turn-prototyping.

9. The apparatus of claim 7, wherein the hardware model and software model can be executed together under the control of system control software to perform in-system verification.

10. The apparatus of claim 1, wherein the design database is used to create a field programmable final product in printed circuit form.

11. The apparatus of claim 10, wherein the field programmable final product in printed circuit form can be used as the hardware model under the control of the host computer.

12. The apparatus of claim 1, wherein the design database is used to create a field programmable final product in silicon chip form.

13. The apparatus of claim 12, wherein the field programmable final product in silicon chip form can be used as the hardware model under the control of the host computer.

14. The apparatus of claim 1, wherein the software model can be used as a virtual special bond-out clip for the hardware model.

* * * * *